(12) United States Patent
Ouchi et al.

(10) Patent No.: US 8,755,196 B2
(45) Date of Patent: Jun. 17, 2014

(54) WIRING BOARD AND METHOD FOR MANUFACTURING THE SAME

(75) Inventors: Shinji Ouchi, Ogaki (JP); Shigeru Yamada, Ogaki (JP); Makoto Terui, Ogaki (JP); Yoshinori Shizuno, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 318 days.

(21) Appl. No.: 13/174,811

(22) Filed: Jul. 1, 2011

(65) Prior Publication Data

US 2012/0006592 A1 Jan. 12, 2012

Related U.S. Application Data

(60) Provisional application No. 61/363,020, filed on Jul. 9, 2010.

(51) Int. Cl.
*H05K 7/00* (2006.01)
*H05K 1/11* (2006.01)
*H01K 3/10* (2006.01)

(52) U.S. Cl.
USPC .............. 361/767; 174/264; 174/267; 29/852

(58) Field of Classification Search
USPC .......... 174/262–264, 267; 361/760, 767, 768; 29/852
See application file for complete search history.

(56) References Cited

U.S. PATENT DOCUMENTS

| | | | |
|---|---|---|---|
| 5,796,591 A * | 8/1998 | Dalal et al. ................... | 361/779 |
| 6,070,785 A * | 6/2000 | Ameen et al. ................. | 228/115 |
| 6,809,415 B2 * | 10/2004 | Tsukada et al. .............. | 257/693 |
| 7,874,198 B2 * | 1/2011 | Groves .......................... | 73/31.01 |
| 7,915,088 B2 * | 3/2011 | Kobayashi et al. ........... | 438/125 |
| 8,164,003 B2 * | 4/2012 | Tang et al. .................... | 174/261 |
| 8,320,135 B2 * | 11/2012 | Ito et al. ........................ | 361/765 |
| 8,413,324 B2 * | 4/2013 | Noda et al. .................... | 29/852 |
| 2004/0238952 A1 * | 12/2004 | Farnworth et al. ............ | 257/734 |
| 2008/0099888 A1 * | 5/2008 | Kurihara et al. .............. | 257/664 |
| 2008/0202803 A1 * | 8/2008 | Nagase et al. ................ | 174/262 |
| 2009/0211793 A1 * | 8/2009 | Nakano et al. ................ | 174/260 |

FOREIGN PATENT DOCUMENTS

| | | |
|---|---|---|
| JP | 2002-064161 | 2/2002 |
| JP | 2007-109965 | 4/2007 |

OTHER PUBLICATIONS

U.S. Appl. No. 13/174,837, filed Jul. 1, 2011, Ouchi, et al.

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

A wiring board including a first insulation layer, a conductive pattern formed on the first insulation layer, a second insulation layer formed on the conductive pattern and the first insulation layer and having an opening portion exposing at least a portion of the conductive pattern, and a connection conductor formed in the opening portion of the second insulation layer such that the connection conductor is positioned on the portion of the conductive pattern. The connection conductor has a tip portion which protrudes from a surface of the second insulation layer and which has a tapered side surface tapering toward an end of the tip portion.

20 Claims, 22 Drawing Sheets

| Connection Conductor | Durability Test Result |
|---|---|
| Tapered Protrusion Structure with Groove (FIG. 7A) | O |
| Comparative Example 1 (FIG. 7B) | △ |
| Comparative Example 2 (FIG. 7C) | △ |
| Comparative Example 3 (FIG. 7D) | × |

FIG.8

WIRING BOARD AND METHOD FOR MANUFACTURING THE SAME

CROSS-REFERENCE TO RELATED APPLICATIONS

The present application claims the benefits of priority to U.S. Application No. 61/363,020, filed Jul. 9, 2010. The contents of that application are incorporated herein by reference in their entirety.

BACKGROUND OF THE INVENTION

1. Field of the Invention

The present invention relates to a wiring board and its manufacturing method.

2. Discussion of the Background

Japanese Laid-Open Patent Publication Nos. 2007-109965 and 2002-64161 each describe a semiconductor device having a semiconductor chip and a wiring board.

A semiconductor device described in Japanese Laid-Open Patent Application No. 2007-109965 has an insulation layer (outermost layer) formed on the above semiconductor chip and a columnar conductor which is formed in the insulation layer and is an passage from an electrode pad of the semiconductor chip to the upper surface of the insulation layer. In such a semiconductor device, the columnar conductor is formed by inserting a conductive rod into a hole formed in the insulation layer, sealing the conductive rod with resin, and performing CMP (chemical mechanical polishing) on surfaces of the insulation layer and the columnar rod.

On the other hand, the semiconductor device described in Japanese Laid-Open Patent Publication No. 2002-64161 has an insulation layer formed on the semiconductor chip, and a conductor (via conductor) filled in a via hole formed in the insulation layer. The via conductor is the electrical passage from an electrode pad of the semiconductor chip through an outermost layer.

The contents of Japanese Laid-Open Patent Publication Nos. 2007-109965 and 2002-64161 are incorporated herein by reference in their entirety in the present application.

SUMMARY OF THE INVENTION

According to one aspect of the present invention, a wiring board including a first insulation layer, a conductive pattern formed on the first insulation layer, a second insulation layer formed on the conductive pattern and the first insulation layer and having an opening portion exposing at least a portion of the conductive pattern, and a connection conductor formed in the opening portion of the second insulation layer such that the connection conductor is positioned on the portion of the conductive pattern. The connection conductor has a tip portion which protrudes from a surface of the second insulation layer and which has a tapered side surface tapering toward an end of the tip portion.

According to another aspect of the present invention, a method for manufacturing a wiring board includes forming a first insulation layer, forming a conductive pattern on the first insulation layer, forming a second insulation layer on the conductive pattern and the first insulation layer such that the second insulation layer covers the conductive pattern, forming in the second insulation layer an opening portion such that at least a portion of the conductive pattern is exposed, forming a conductor in the opening portion such that the conductor is positioned on the portion of the conductive pattern, and removing a portion of the conductor in the opening portion such that a connection conductor having a tip portion which protrudes from a surface of the second insulation layer and which has a tapered side surface is formed on the portion of the conductive pattern exposed through the opening portion in the second insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 is a table showing simulation results of durability testing carried out on each connection conductor;

DETAILED DESCRIPTION OF THE EMBODIMENTS

Figure 1:
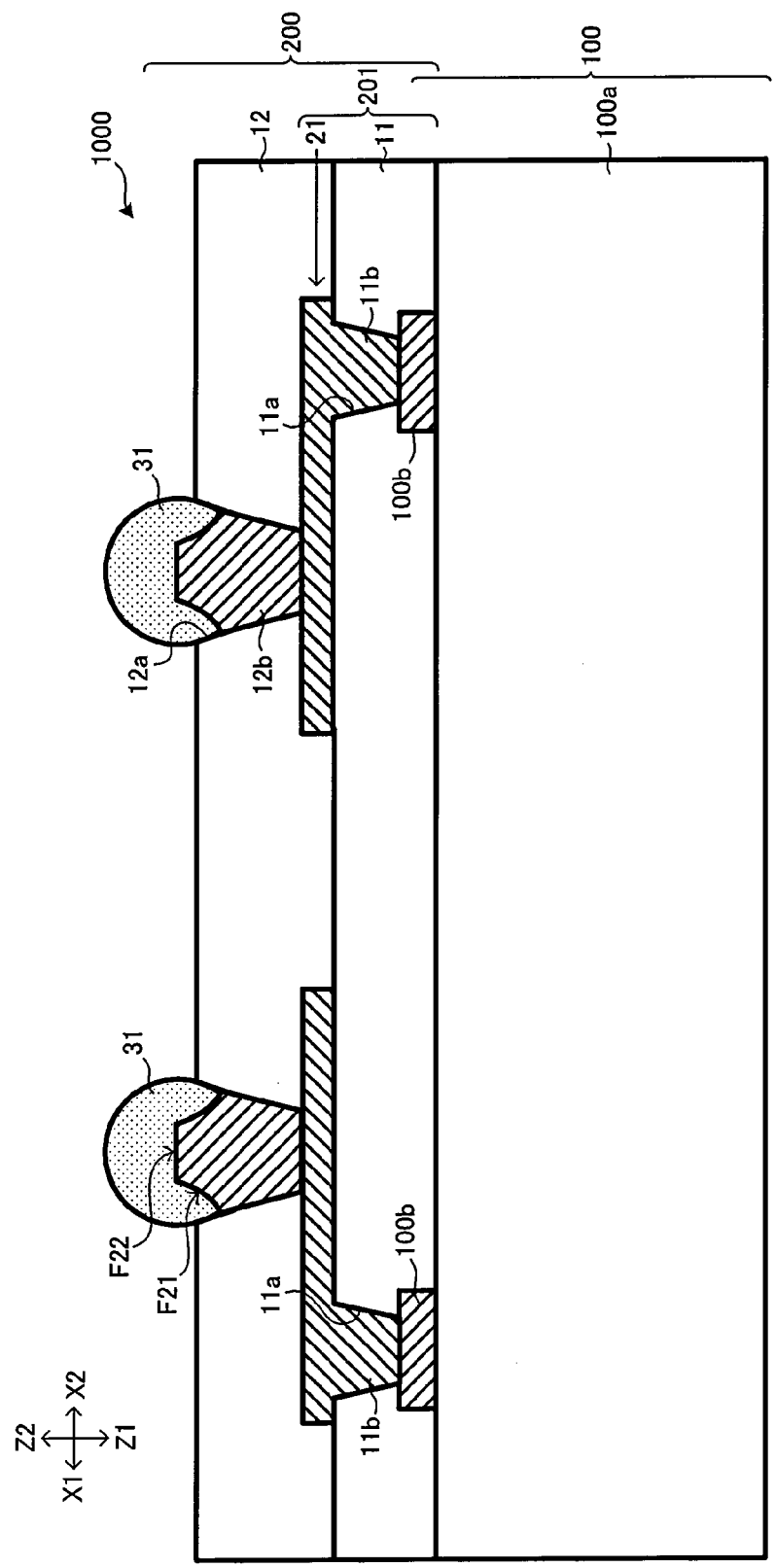
FIG. 1 is a cross-sectional view showing a semiconductor device having a wiring board according to the first embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction corresponding to a direction along a normal line (or a thickness direction) to the main surfaces (upper and lower surfaces) of each layer. On the other hand, arrows (X1, X2) and (Y1, Y2) each indicate a direction perpendicular to a lamination direction (directions parallel to the main surfaces of each layer). The main surfaces of each layer are on the X-Y plane. Side surfaces of each layer are on the X-Z plane or the Y-Z plane.

Regarding a connection conductor or its hole, a cross section (X-Y plane) perpendicular to directions Z is referred to as a horizontal cross section. Also, a cross section (X-Z plane or Y-Z plane) parallel to directions Z is referred to as a vertical cross section.

Two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In a lamination direction, the side closer to the base (such as semiconductor chip 100 in the first embodiment) is referred to as a lower layer (or inner-layer side), and the side farther from the base is referred to as an upper layer (or outer-layer side).

Conductive patterns include layers of plain patterns such as a power-source layer and ground layer; wiring such as signal lines; pads, lands and so forth.

Opening portions include notches, slits and the like along with holes and grooves. Holes are not limited to penetrating holes but also include non-penetrating holes. Holes include via holes and through holes. The conductor formed in a via hole is referred to as a via conductor, and the conductor formed in a through hole is referred to as a through-hole conductor.

Plating indicates depositing a layer of conductor (such as metal) on surfaces of metal, resin or the like as well as the deposited conductive layer (such as a metal layer). Plating includes wet plating such as electrolytic plating as well as dry plating such as PVD (physical vapor deposition) and CVD (chemical vapor deposition).

The "width" of a hole or a column (protrusion) indicates the diameter if it is a circle and $2\sqrt{\text{cross section}/\pi}$ if it is not a circle, unless otherwise indicated. When a hole or a column (protrusion) tapers, whether the "widths" of two or more holes or protrusions are the same or different may be determined by comparing values, average values, maximum values or the like of corresponding portions.

First Embodiment

As shown in FIG. 1, semiconductor device 1000 of the present embodiment has wiring board 200 and semiconductor chip 100 formed on wiring board 200. Wiring board 200 has rewiring section 201, insulation layer 12 (interlayer insulation layer), connection conductors (12b) and bumps 31. Rewiring section 201 is formed on semiconductor chip 100 (Z2 side). Insulation layer 12 is formed on rewiring section 201 (Z2 side). Multiple holes (12a) (opening portions) are formed in insulation layer 12, and connection conductor (12b) is formed in each hole (12a). Then, bump 31 is formed on each connection conductor (12b). Bump 31 coats the tip portion of connection conductor (12b).

Figure 2A:
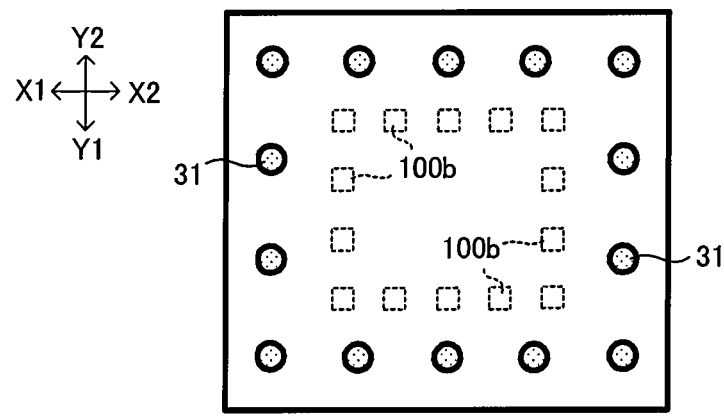
FIG. 2A is a view showing a first example of positioning electrode pads of a semiconductor chip and bumps (external connection terminals) according to the first embodiment of the present invention.
Figure 2B:
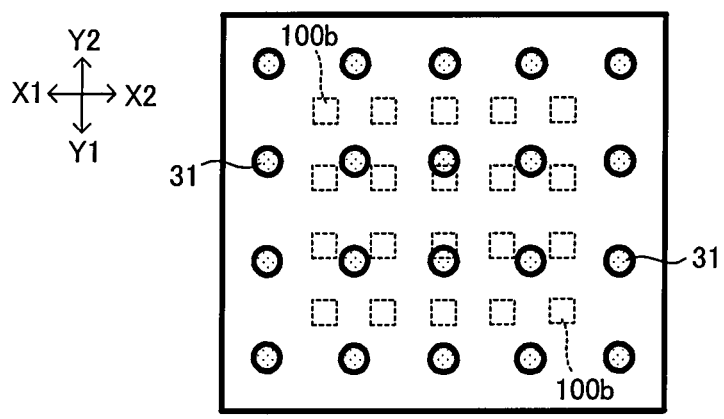
FIG. 2B is a view showing a second example of positioning electrode pads of a semiconductor chip and bumps (external connection terminals) according to the first embodiment of the present invention.

In semiconductor device 1000 of the present embodiment, positioning electrode pads (100b) of semiconductor chip 100 (inner-layer side terminals) and bumps 31 (outer-layer side terminals) is not limited specifically. For example, as shown in FIG. 2A, electrode pads (100b) may be positioned in a peripheral style (peripheral-terminal type), while bumps 31 may be positioned inside the region where electrode pads (100b) are formed. Alternatively, as shown in FIG. 2B, for example, electrode pads (100b) may be positioned in an area-array style, while bumps are positioned in area-array style with a wider terminal pitch. However, positioning each terminal is not limited to the above.

Semiconductor chip 100 has chip body (100a) and multiple electrode pads (100b). Electrode pads (100b) are arranged on chip body (100a) with predetermined positioning (see FIGS. 2A and 2B, for example). Semiconductor chip 100 is an IC chip with integrated elements such as resistor, diode, transistor and capacitor. Chip body (100a) is made of silicon, for example.

Rewiring section 201 has insulation layer 11, via conductor (11b) and conductive pattern 21. Conductive pattern 21 is formed on the second surface of insulation layer 11 and is patterned to widen the terminal pitch of semiconductor chip 100. Hole (11a) (via hole) is formed in insulation layer 11. By filling conductor (such as copper plating) in hole (11a), via conductor (11b) is formed. Electrode pad (100b) of semiconductor chip 100 and conductive pattern 21 are electrically connected by via conductor (11b).

Via conductor (11b) is formed to be a tapered column (truncated cone) which tapers so that the diameter increases from electrode pad (100b) toward conductive pattern 21, for example. The shape of a horizontal cross section (X-Y plane) of via conductor (11b) is a complete circle, for example. However, via conductor (11b) is not limited to being formed as above, and any other shape may be taken.

Insulation layer 11 is made of polyimide, for example. However, the material for insulation layer 11 is not limited to polyimide, and it may be wiring barrier film using an inorganic insulator or low-temperature inorganic glass, for example. Conductive pattern 21 is double-layered with electroless copper plating (lower layer) and electrolytic copper plating (upper layer), for example. However, the material for conductive pattern 21 is not limited specifically. For example, copper foil may be added beneath the electroless plating. Alternatively, conductive pattern 21 may be formed only with electroless copper plating. Yet alternatively, the material for conductive pattern 21 may be conductors other than copper.

Insulation layer 12 is made of epoxy resin, for example. However, the material for insulation layer 12 is not limited specifically.

Hole (12a) is a via hole, for example. Hole (12a) exposes part of conductive pattern 21.

Figure 3:
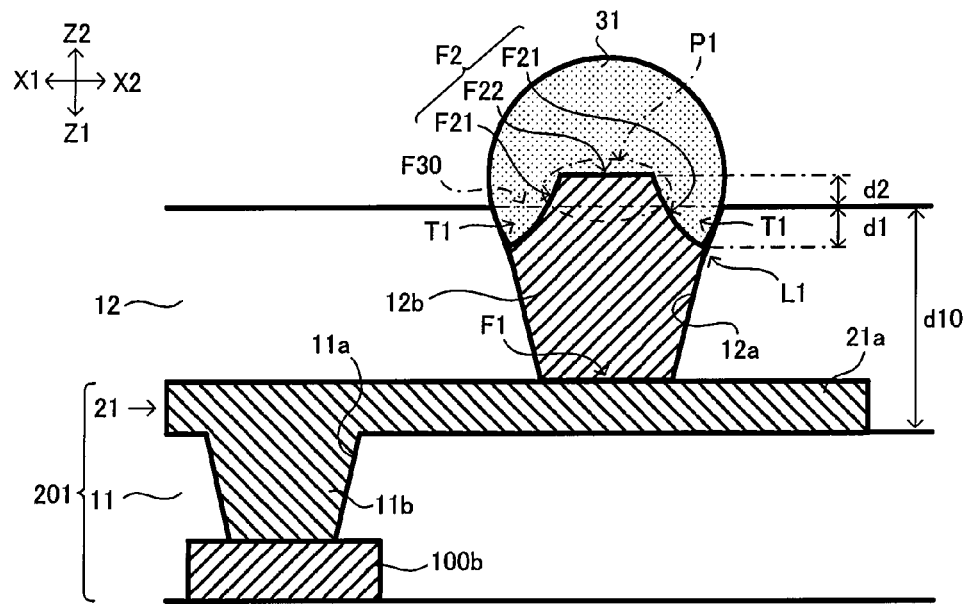
FIG. 3 is a magnified view showing part of FIG. 1.

Connection conductor (12b) is formed on the conductive pattern exposed through hole (12a) (opening portion). As shown in FIG. 3 (magnified view of FIG. 1), the tip portion of connection conductor (12b) protrudes toward the Z2 side from the second surface (main surface on the Z2 side) of insulation layer 12. The tip portion of connection conductor (12b) is positioned outside of hole (12a). Tip portion (P1) is formed to be a tapered column (truncated cone), tapering so that the diameter decreases toward the Z2 side (upper layer), for example. A vertical cross section of tip portion (P1) is substantially trapezoidal. Connection conductor (12b) has side surface (F21). Side surface (F21) tapers toward the tip side (the Z2 side). Because of side surface (F21), connection conductor (12b) becomes gradually thinner toward the Z2 side (upper layer). Connection conductor (12b) of the present embodiment does not have a land.

Figure 4:
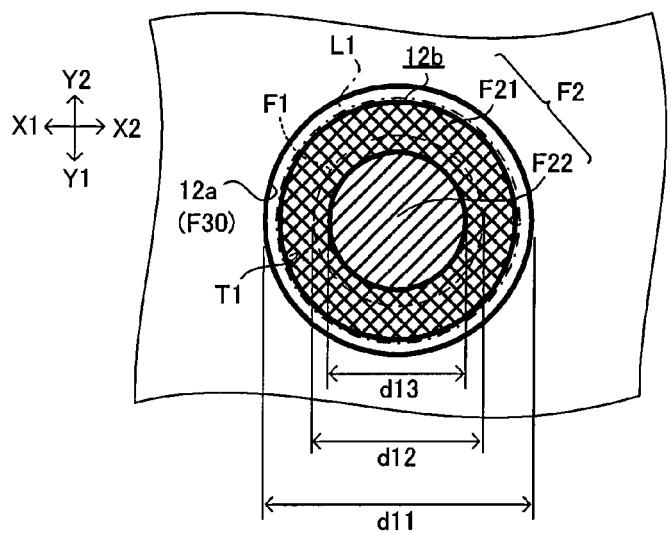
FIG. 4 is a view showing a planar structure of a connection conductor.

Horizontal cross sections (on the X-Y plane) of connection conductor (12b) and hole (12a) are circular as shown in FIG. 4, for example. The horizontal cross section of tip portion (P1) is also circular, for example. However, they are not limited to such (see later-described FIGS. 26A~29).

The tip portion of connection conductor (12b) has tapered side surface (F21) and flat top surface (F22). More specifically, Z2-side end surface (F2) of connection conductor (12b) is partially tapered. However, the present embodiment is not limited to such and end surface (F2) may be entirely tapered (see later-described FIG. 31). As shown in FIG. 4, top surface (F22) is positioned in the center of connection conductor (12b), for example, and side surface (F21) is formed to be annular surrounding top surface (F22), for example. However, top surface (F22) and side surface (F21) are not limited to the above and any other shape may be employed (see later-described FIG. 26A~27).

Top surface (F22) is on the X-Y plane, for example. However, top surface (F22) is not limited to such, and it may be an inclined surface (flat surface) sloped against the X-Y plane (see later-described FIG. 30). Also, top surface (F22) may be a curved surface or a roughened surface.

On the other hand, side surface (F21) is a curved surface, for example. The contact area increases between connection conductor (12b) and bump 31, and the connection strength is considered to be improved. As a result, the durability and reliability of the connected portion increase. However, side surface (F21) is not limited to such, and it may also be an inclined surface (plane) (see later-described FIG. 24).

Connection conductor (12b) is in contact with conductor (21a) of conductive pattern 21, insulation layer 12 and bump 31. In particular, connection conductor (12b) is the Z1-side end portion in hole (12a), more specifically, end surface (F1) on the Z1 side and is in contact with conductor (21a) of conductive pattern 21. In addition, contact line (L1) between the tip portion of connection conductor (12b) (in particular, end surface (F2) on the Z2 side) and insulation layer 12 is positioned toward the Z1 side from the second surface (Z2-side main surface) of insulation layer 12. Namely, connection conductor (12b) is in contact with insulation layer 12 only inside hole (12a). Accordingly, groove (T1) (recess) is formed around tip portion (P1). Contact line (L1) is positioned toward the Z1 side from the Z2-side main surface of insulation layer 12 by depth (d1) of groove (T1). However, the present embodiment is not limited to the above, and whether or not groove (T1) is formed and where contact line (L1) is positioned may be determined freely (see later-described FIGS. 25A, 25B). Alternatively, a recess other than a groove (such as a non-penetrating hole) may be formed between side surface (F21) of the tip portion of connection conductor (12b) and the wall surface of hole (12a) (opening portion) in insulation layer 12 (second insulation layer). Especially, if multiple non-penetrating holes are formed continuously with a predetermined interval, substantially the same effects are achieved as those with a groove.

Figure 5:
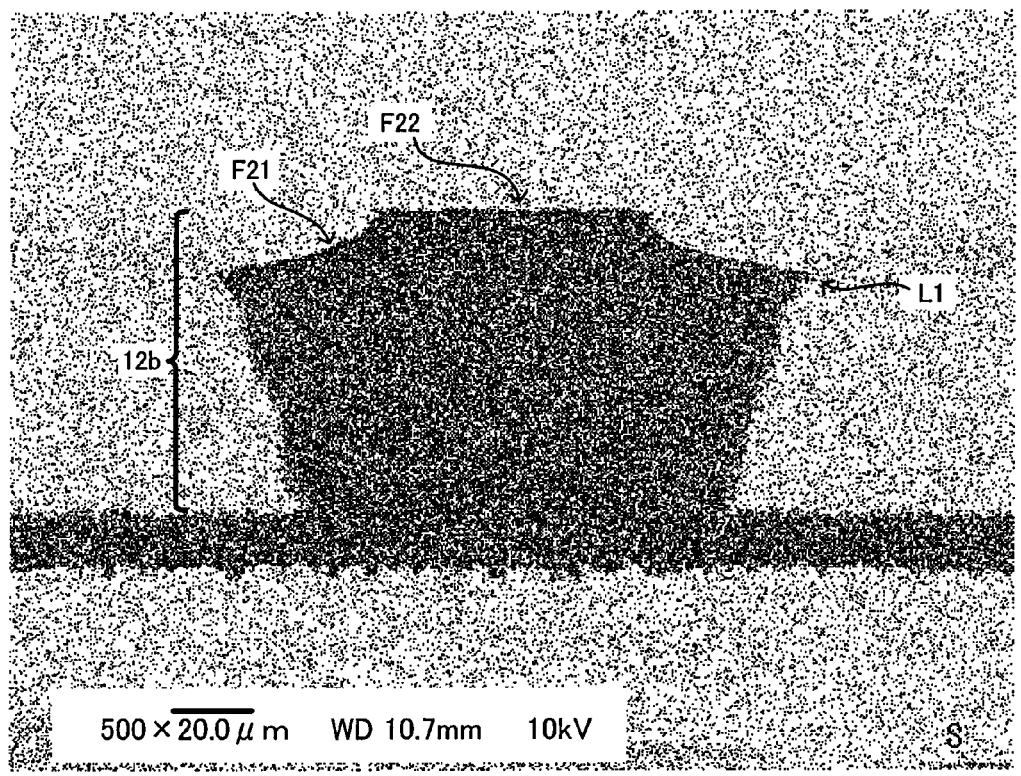
FIG. 5 is an SEM (scanning electron microscope) photograph of a connection conductor.
Figure 6:
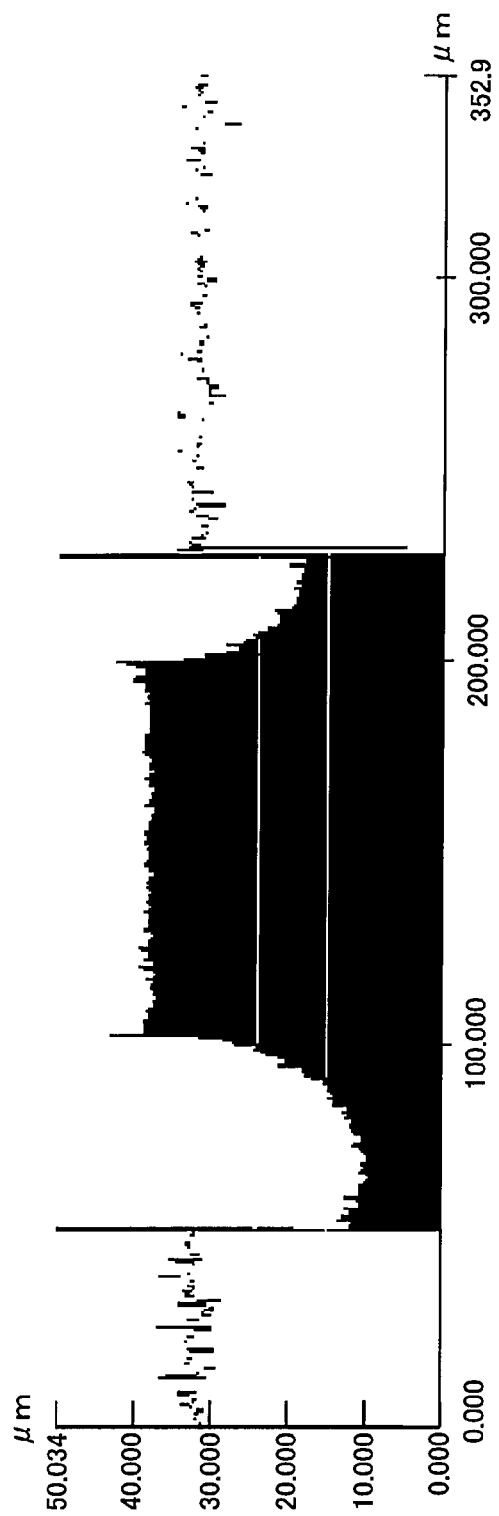
FIG. 6 is a graph showing an example of the outline of a connection conductor.

FIG. 5 is an SEM photograph of connection conductor (12b). FIG. 6 is a graph showing an outline example of connection conductor (12b). Depth (d1) (FIG. 3) of groove (T1) is approximately 20 μm~30 μm, for example, as shown in FIG. 6. Protruding amount (d2) (FIG. 3) of connection conductor (12b) is approximately 10 μm, for example, as shown in FIG. 6. Width (d11) (FIG. 4) of Z2-side opening surface (F30) (FIG. 3) of hole (12a) is approximately 175 μm, for example, as shown in FIG. 6, and width (d13) is approximately 100 μm. Width (d11) is approximately 1.75 times width (d13).

Bump 31 is filled in groove (T1), while being in contact with the Z2-side end portion (including tip portion P1) of connection conductor (12b). Bump 31 is a solder bump, for example. To connect wiring board 200 with another electronic component (such as a semiconductor element or motherboard) and to mount wiring board 200 on a wiring board are achieved through bump 31.

According to wiring board 200 of the present embodiment, reliability is enhanced by suppressing cracking. In the following, the reasons are provided while comparing wiring board 200 of the present embodiment with Comparative Examples (1)~(3).

Figure 7A:
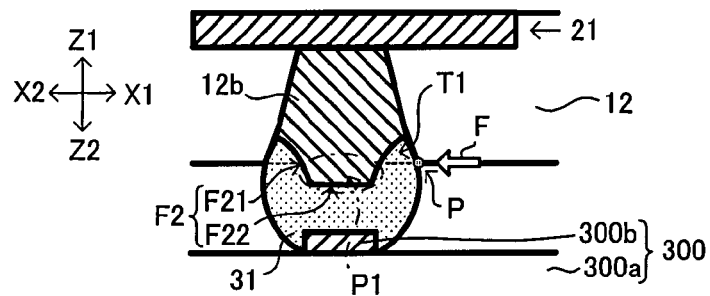
FIG. 7A is a cross-sectional view of a connection conductor in the first embodiment.

As shown in FIG. 7A, connection conductor (12b) of the present embodiment has a tapered protrusion structure with a groove as described previously (see FIG. 3).

Figure 7B:
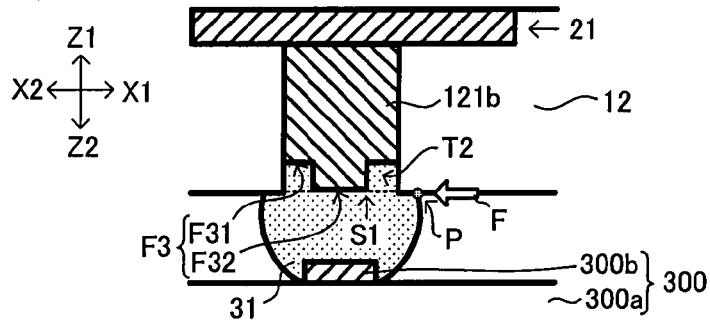
FIG. 7B is a cross-sectional view of a connection conductor in Comparative Example (1)

As shown in FIG. 7B, in connection conductor (121b) of Comparative Example (1), the tip portion does not protrude and there is no tapered surface. First surface (F31) and second surface (F32) which form Z2-side end surface (F3) of connection conductor (121b) are each on the X-Y plane. Step (S1) is formed between first surface (F31) and second surface (F32), where first surface (F31) is positioned on the Z1 side (lower-layer side) and second surface (F32) is positioned on the Z2 side (upper-layer side). The position (Z coordinate) of second surface (F32) (top surface) corresponds substantially to that of the second surface of insulation layer 12. Namely, first surface (F31) is positioned toward the Z1 side from the second surface of insulation layer 12. Accordingly, groove (T2) is formed on the Z2 side of first surface (F31).

Figure 7C:
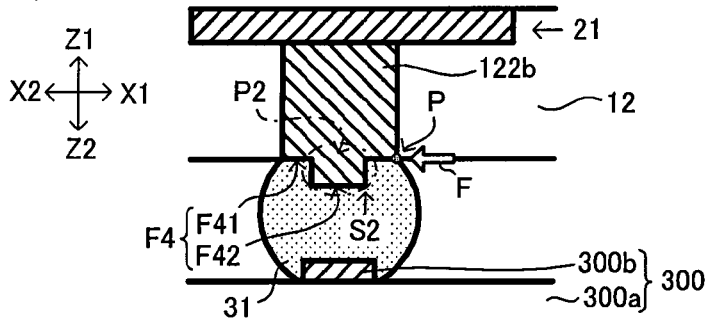
FIG. 7C is a cross-sectional view of a connection conductor in Comparative Example (2)

As shown in FIG. 7C, connection conductor (122b) of Comparative Example (2), has protruding tip portion (P2) but does not have a tapered surface. First surface (F41) and second surface (F42) which form Z2-side end surface (F4) of connection conductor (122b) are each on the X-Y plane. Step (S2) is formed between first surface (F41) and second surface (F42), and first surface (F41) is positioned on the Z1 side (lower-layer side) and second surface (F42) is positioned on the Z2 side (upper-layer side). The position (Z coordinate) of first surface (F41) corresponds substantially to that of the second surface of insulation layer 12. Namely, no groove is formed. In addition, second surface (F42) (top surface) is positioned toward the Z2 side beyond the second surface of insulation layer 12.

Figure 7D:
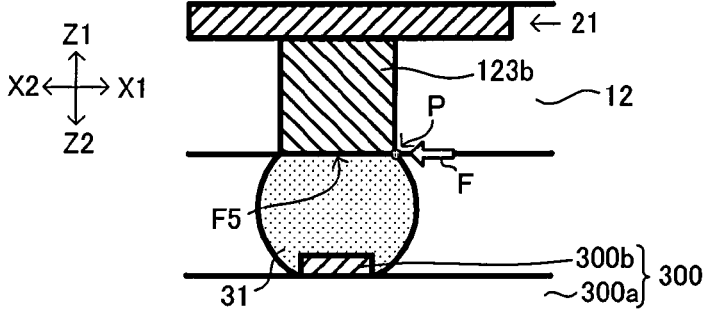
FIG. 7D is a cross-sectional view of a connection conductor in Comparative Example (3)

As shown in FIG. 7D, in connection conductor (123b) of Comparative Example (3), the tip portion does not protrude and there is no tapered surface. Moreover, Z2-side end surface (F5) of connection conductor (123b) does not have a step and is a flat surface (in particular, on the X-Y plane). The position (Z coordinate) of end surface (F5) corresponds substantially to that of the second surface of insulation layer 12. Namely, there is no step between end surface (F5) and the second surface of insulation layer 12, and those surfaces are set flush.

FIGS. 7A~7D each show an example in which electronic component 300 is mounted on the above connection conductor (12b) or (121b~123b) through bump 31. Electronic component 300 is formed with component body (300a) and electrode (300b). Bump 31 makes contact with electrode (300b) of electronic component 300, while making contact with Z2-side end surfaces (F2~F5) of connection conductors (12b, 121b~123b) respectively. In addition, bump 31 is filled in groove (T1, T2).

FIG. 8 shows simulation results of durability tests carried out respectively on connection conductor (12b) (FIG. 7A), connection conductor (121b) (FIG. 7B), connection conductor (122b) (FIG. 7C) and connection conductor (123b) (FIG. 7D). When carrying out such durability testing, situations such as heat cycles and being dropped are assumed. In each test, as shown in FIGS. 7A~7D, stress (F) transmitted from the X1 side toward the X2 side along the second surface of insulation layer 12 is exerted on any of connection conductors (12b) and (121b~123b) or bump 31 at point (P).

As the simulation results show in FIG. 8, the connection conductor with the highest durability was connection conductor (12b) (a tapered protrusion structure with a groove in the present embodiment) ("○" in FIG. 8). On the other hand, the connection conductor with the lowest durability was connection conductor (123b) (Comparative Example (3)) ("x" in FIG. 8). In addition, the durability of connection conductor (121b) (Comparative Example (1)) and connection conductor (122b) (Comparative Example (2)) is lower than that of connection conductor (12b) but higher than that of connection conductor (123b) ("□" in FIG. 8). The reasons for those are as follows.

Regarding connection conductors (12b) and (121b), stress (F) is exerted on bump 31 (point P) as shown in FIGS. 7A and 7B. By contrast, regarding connection conductors (122b) and (123b), stress (F) is exerted on the interface (point P) between connection conductor (122b) or (123b) and bump 31 as shown in FIGS. 7C and 7D. Since stress is mitigated to a certain degree by bump 31 (such as a solder bump), the former is advantageous from the viewpoint of durability.

In addition, whether an interface (the interface between a connection conductor and a bump) parallel to stress (F) exists in the direction of stress (F) (direction X) is observed, there is second surface (F32) in connection conductor (121b), first surface (F41) in connection conductor (122b) and end surface (F5) in connection conductor (123b). Since strength at an interface is low, cracking tends to occur if stress (F) is exerted parallel to such an interface. By contrast, since tapered tip portion (P1) protrudes toward the Z2 side beyond the second surface of insulation layer 12 in connection conductor (12b) of the present embodiment, if stress (F) further progresses toward the X2 side beyond point (P) along the direction X, stress (F) would be exerted on side surface (F21) (tapered surface). Since side surface (F21) is not a parallel surface (X-Y plane) to stress (F), the above cracking is suppressed in connection conductor (12b).

In addition, since connection conductor (12b) has protruding tip portion (P1), it is easier to reduce the distance from electronic component 300. Accordingly, it is considered easy to enhance the connection strength between connection conductor (12b) and electrode (300b) of electronic component 300. Also, anchor effects are achieved between tip portion (P1) and bump 31. Moreover, since groove (T1) is formed around tip portion (P2) in connection conductor (12b) of the present embodiment, tip portion (P1) and insulation layer 12 do not make contact. Since there is no interface (the interface between connection conductor (12b) and the second surface of insulation layer 12) where stress tends to be generated, cracking is suppressed from occurring inside insulation layer 12.

The results shown in FIG. 8 are derived from the above reasons. Accordingly, using wiring board 200 of the present embodiment improves durability against situations such as heat cycles and being dropped. Also, as a result, wafer-level packaging with higher reliability is achieved.

Figure 9A:
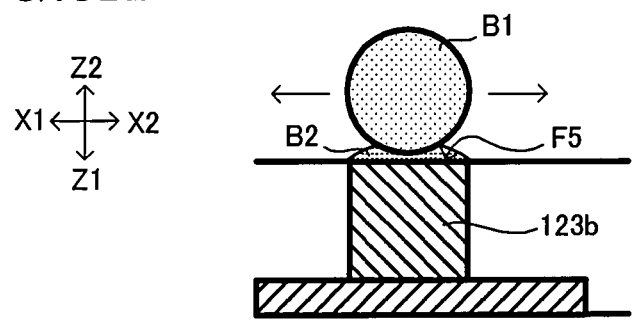
FIG. 9A is a cross-sectional view showing a solder ball loaded on the connection conductor of Comparative Example (3)
Figure 9B:
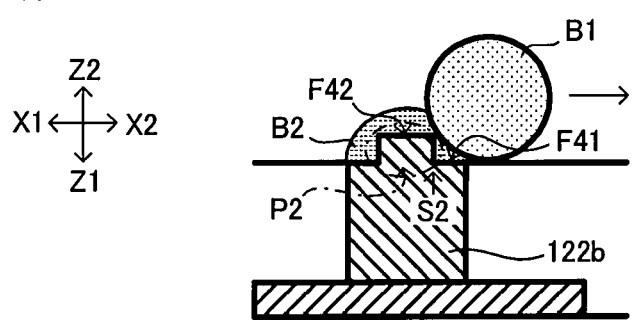
FIG. 9B is a cross-sectional view showing a solder ball loaded on the connection conductor of Comparative Example (2)
Figure 9C:
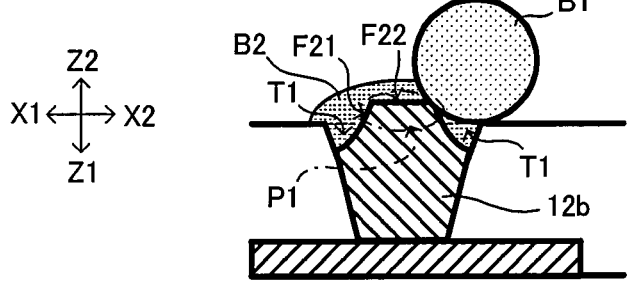
FIG. 9C is a cross-sectional view showing a solder ball loaded on the connection conductor of the first embodiment.

Because of groove (T1) of connection conductor (12b), effects such as mitigating stress (F) are achieved by positioning bump 31 between insulation layer 12 and tip portion (P1) as described above. In addition, effects such as easy alignment are also achieved when loading a bump. In the following, the reasons for that are provided with reference to FIGS. 9A~9C. FIGS. 9A~9C show how to load solder ball (B1) on connection conductors (123b), (122b) and (12b) respectively. In those examples, before loading solder ball (B1), flux (B2) is applied on connection conductors (123b), (122b) and (12b), and solder ball (B1) is loaded on connection conductors (123b), (122b) and (12b) respectively through flux (B2).

In particular, as shown in FIG. 9A, since Z2-side end surface (F5) and the second surface of insulation layer 12 are made flush in the example of connection conductor (123b), solder ball (B1) moves freely either toward the X1 side or the X2 side. Accordingly, the position of solder ball (B1) tends to shift.

As shown in FIG. 9B, since connection conductor (122b) has protruding tip portion (P2), step (S2) is formed between first surface (F41) and second surface (F42). Accordingly, solder ball (B1) is regulated by step S2 from moving in a direction X (toward the X1 side, for example). However, since solder ball (B1) is allowed to move freely in the other direction X (toward the X2 side, for example), the position of solder ball (B1) also tends to shift in that direction (toward the X2 side, for example).

By contrast, connection conductor (12b) of the present embodiment has groove (T1) around protruding tip portion (P1) as shown in FIG. 9C. Accordingly, solder ball (B1) is fit into the groove and fixed to a certain degree. Thus, solder ball (B1) (bump 31, eventually) is easier to align. Also, since solder ball (B1) is aligned to be in contact with tip portion (P1), when solder ball (B1) is fused through thermal treatment (such as a reflow), bump 31 is formed at least to be in contact with tip portion (P1) (FIG. 3, FIG. 7A). In addition, if solder ball (B1) is fused, fused solder fills groove (T1) around tip portion (P1) first. Thus, bump 31 is suppressed from being deformed and the adhesiveness of bump 31 is enhanced. Moreover, since the side surface of groove (T1) is gently curved (side surface F21), voids tend to be eliminated along the tapered surface while solder ball (B1) is reflowed. As a result, voids tend to be suppressed from occurring. For that matter, when solder is filled in angular grooves such as groove (T2) of connection conductor (121b), voids tend to occur in the corners.

Next, a method is described for manufacturing semiconductor device 1000 including the above wiring board 200. In the present embodiment, semiconductor device 1000 is manufactured in a method shown in FIG. 10.

Figure 11:
FIG. 11 is a view to illustrate a first step for manufacturing a semiconductor device according to the first embodiment.

In step (S11), semiconductor chip 100 is prepared as shown in FIG. 11. Semiconductor chip 100 is an IC chip, for example, as described previously.

Figure 10:
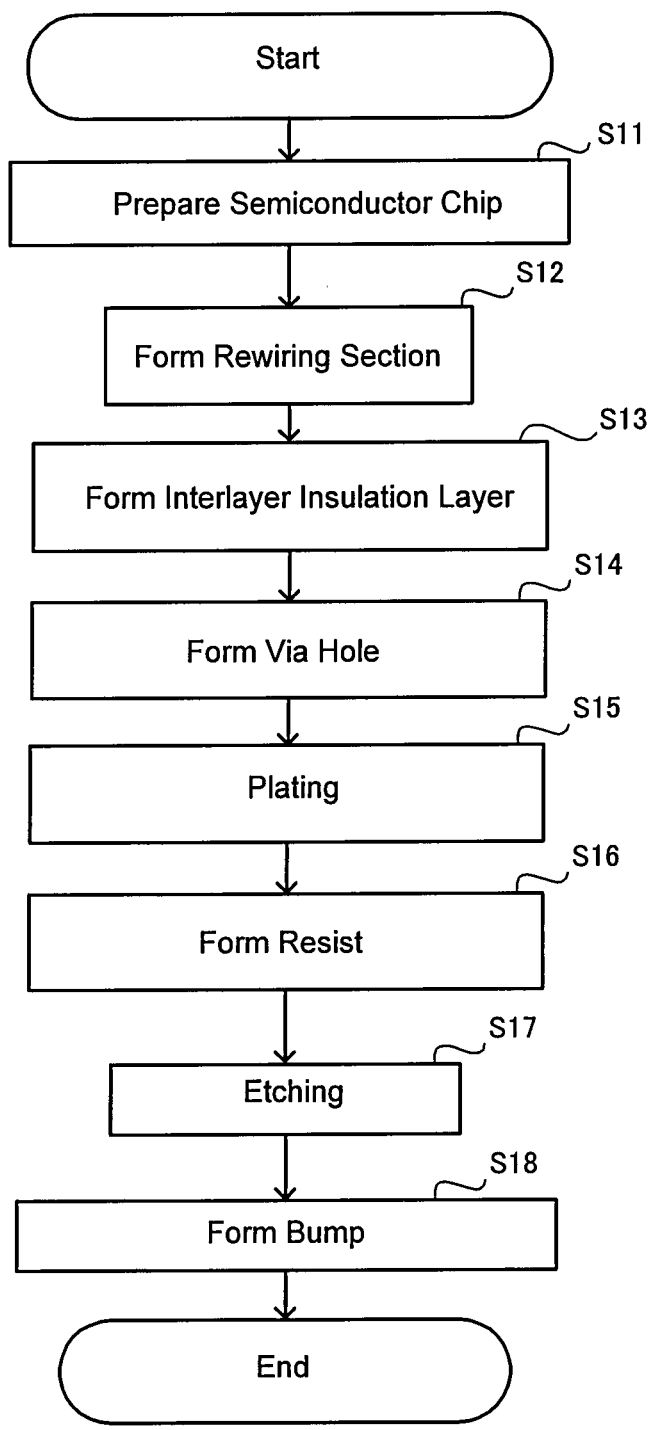
FIG. 10 is a flowchart showing a method for manufacturing a semiconductor device according to the first embodiment.

Next, in step (S 12) in FIG. 10, rewiring section 201 is formed.

Figure 12:
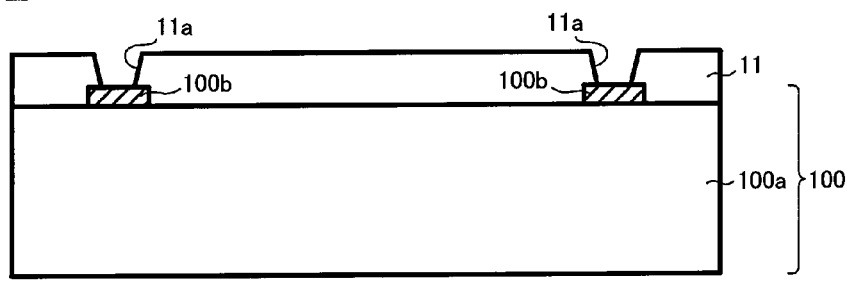
FIG. 12 is a view to illustrate a second step subsequent to the step in FIG. 11.

As shown in FIG. 12, insulation layer 11 is formed by lamination, for example, on semiconductor chip 100 (Z2 side). As described above, insulation layer 11 is made of polyimide, for example. Next, using a laser, for example, hole (11a) is formed in insulation layer 11. Hole (11a) reaches electrode pad (100b) of semiconductor chip 100. Then, desmearing and soft etching are conducted if required.

Figure 13:
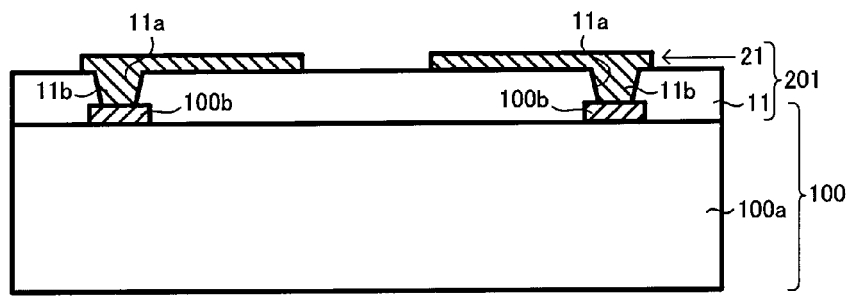
FIG. 13 is a view to illustrate a third step subsequent to the step in FIG. 12.

Next, as shown in FIG. 13, using a full additive method, semi-additive (SAP) method, subtractive method or the like, for example, via conductor (11b) and conductive pattern 21 are formed. Accordingly, rewiring section 201 is completed.

Next, in step (S13) in FIG. 10, an interlayer insulation layer (insulation layer 12) is formed.

Figure 14:
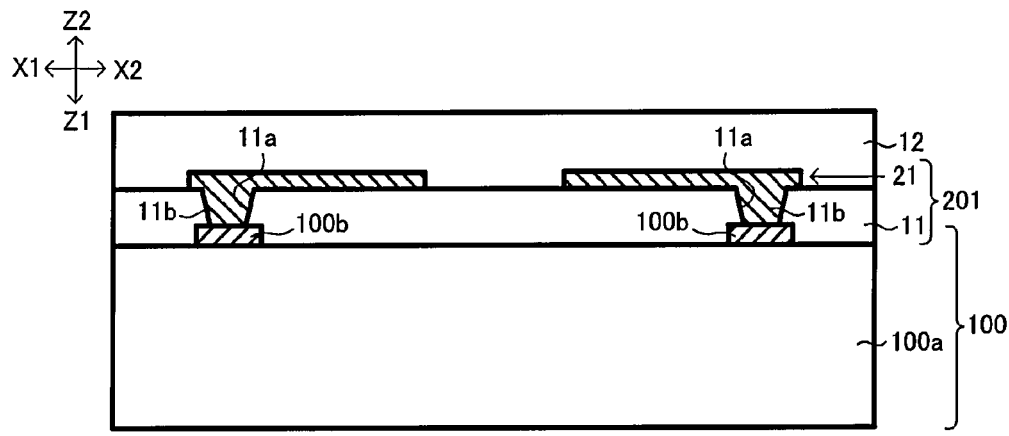
FIG. 14 is a view to illustrate a fourth step subsequent to the step in FIG. 13.

As shown in FIG. 14, insulation layer 12 is formed by lamination, for example, on the second surface of insulation layer 11 and on the second surface of conductive pattern 21 in rewiring section 201. Insulation layer 12 is formed to coat conductive pattern 21. Insulation layer 12 is made of ABF (epoxy resin) made by Ajinomoto, for example.

Figure 15:
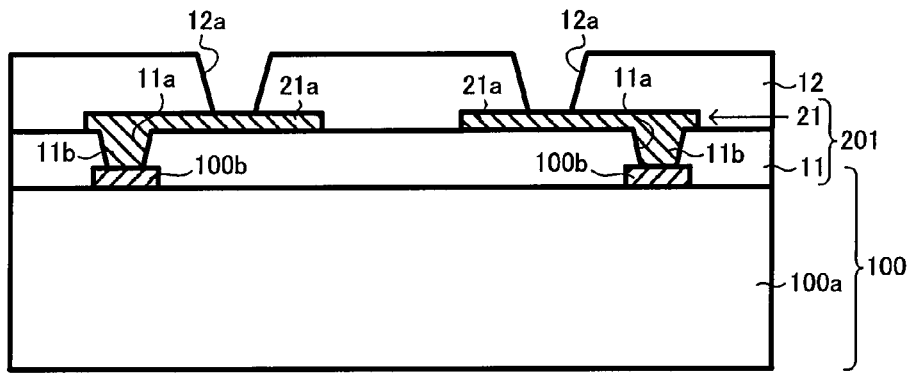
FIG. 15 is a view to illustrate a fifth step subsequent to the step in FIG. 14.

Next, in step (S14) in FIG. 10, a via hole is formed. In particular, as shown in FIG. 15, hole (12a) (opening portion) is formed in insulation layer 12 using a laser, for example. Hole (12a) reaches conductor (21a) of conductive pattern 21 and exposes part of conductive pattern 21. Then, desmearing and soft etching are conducted if required.

Next, in step (S15) in FIG. 10, plating is performed.

Figure 16:
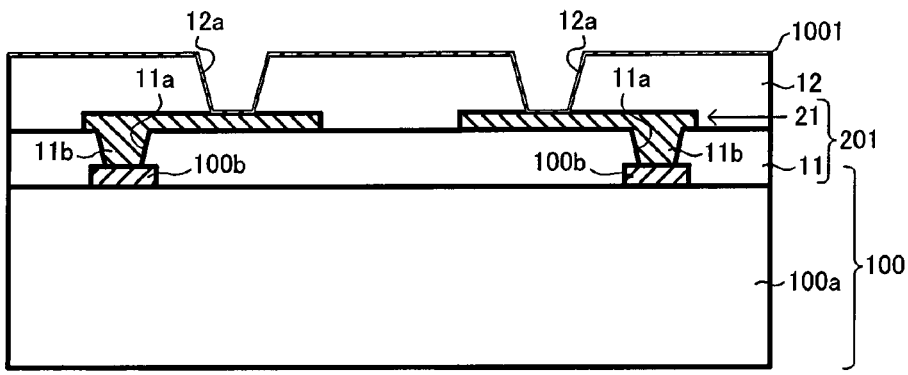
FIG. 16 is a view to illustrate a sixth step subsequent to the step in FIG. 15.

As shown in FIG. 16, by copper panel plating (plating the entire surface including the inside of hole (12a)), for example, seed layer 1001 is formed on the second surface of insulation layer 12 and inside hole (12a). Panel plating is performed by wet or dry electroless plating, specifically by sputtering or the like.

Figure 17:
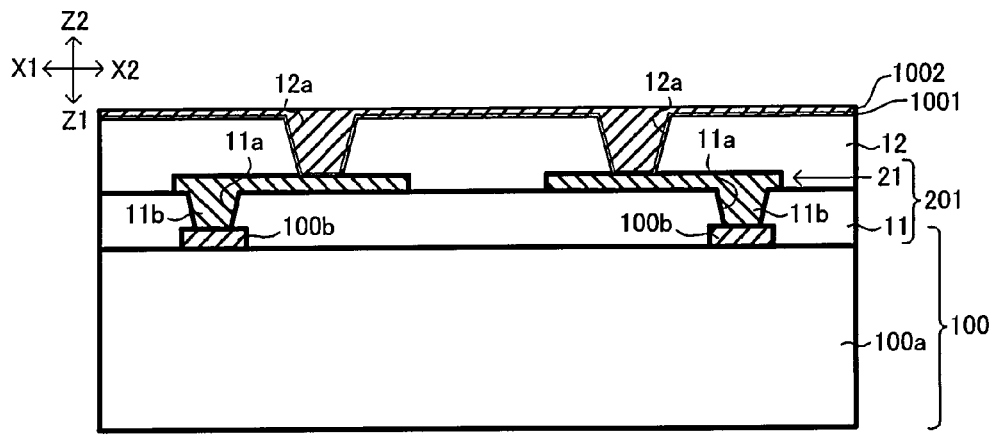
FIG. 17 is a view to illustrate a seventh step subsequent to the step in FIG. 16.

Next, as shown in FIG. 17, by using seed layer 1001 as a feed layer, for example, electrolytic plating is performed. In doing so, electrolytic copper plating 1002, for example, is formed on the second surface of insulation layer 12 and on the second surface of seed layer 1001 inside hole (12a). As a result, conductor (seed layer 1001 and electrolytic plating 1002) is filled in hole (12a) (opening portion), while a conductive pattern is formed on the conductor in hole (12a) and on insulation layer 12.

Figure 18:
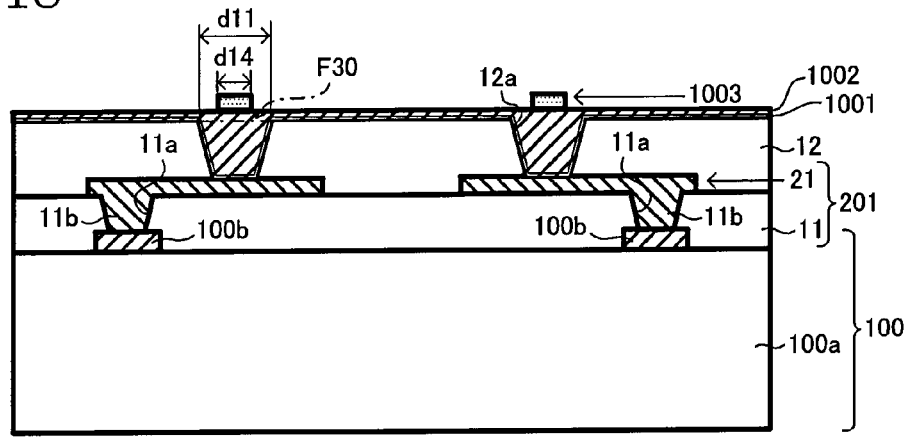
FIG. 18 is a view to illustrate an eighth step subsequent to the step in FIG. 17.

Next, in step (S16) in FIG. 10, etching resist is formed. In particular, resist is applied on the above conductive pattern, namely, on electrolytic plating 1002 (entire surface), and the applied resist is patterned using a lithographic technique, for example. In doing so, resist 1003 (etching resist) having width (d14) smaller than width (d11) of Z2-side opening surface (F30) of hole (12a) is formed on the conductor filled in hole (12a) (more specifically, on electrolytic plating 1002 deposited over hole (12a)) (on the Z2 side) as shown in FIG. 18. In addition, resist 1003 has opening (1003a) to expose part of the conductive pattern (seed layer 1001 and electrolytic plating 1002).

Figure 19:
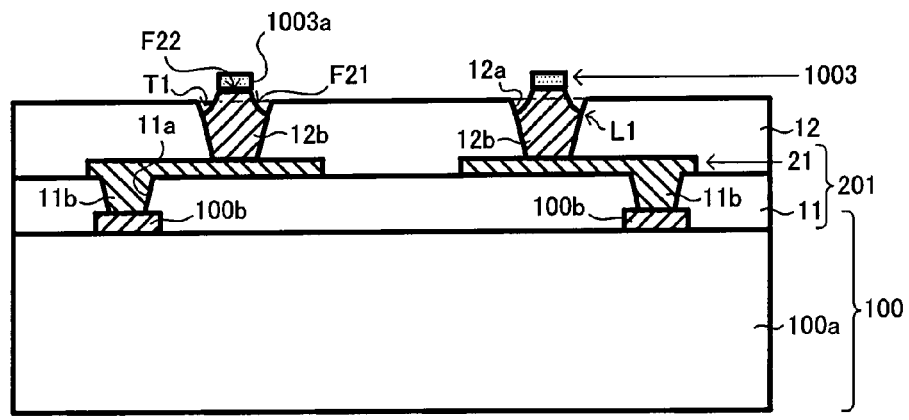
FIG. 19 is a view to illustrate a ninth step subsequent to the step in FIG. 18.

Next, in step (S17) in FIG. 10, etching is conducted. In particular, as shown in FIG. 19, the conductor (seed layer 1001 and electrolytic plating 1002) covered partially by resist 1003 is etched (so-called tenting etching). Such etching is performed by wet etching, for example. Accordingly, the conductive pattern exposed through opening (1003a) of the etching resist is removed. As a result, connection conductor (12b) is formed on the conductive pattern exposed through hole (12a) (opening portion) in insulation layer 12. Connection conductor (12b) has a tapered protrusion structure with a groove as shown previously in FIG. 3. Namely, tip portion (P1) of connection conductor (12b) protrudes beyond the surface of insulation layer 12 and has side surface (F21) tapering toward the tip.

Next, in step (S18) in FIG. 10, bump 31 is formed on connection conductor (12b). Specifically, after flux is applied, for example, a solder ball is loaded on connection conductor (12b) through the flux, and the entire semiconductor chip 100 with the loaded solder ball is reflowed (thermal treatment) (see FIG. 9C). In doing so, bump 31 is formed on connection conductor (12b), and semiconductor device 1000 as shown previously in FIG. 1 is completed.

As described above, in the manufacturing method of the present embodiment, when forming connection conductor (12b), a polishing step is not required. Namely, according to the above manufacturing method, above semiconductor device 1000 (FIG. 1) with higher reliability is manufactured in a simplified process.

Second Embodiment

The second embodiment of the present invention is described by concentrating on differences with the above first embodiment. Here, the numerical references are applied to elements the same as shown in the above FIG. 1 and the like, and the portion already described in the above, namely, if its description would be redundant, will be omitted here for convenience sake.

Figure 20:
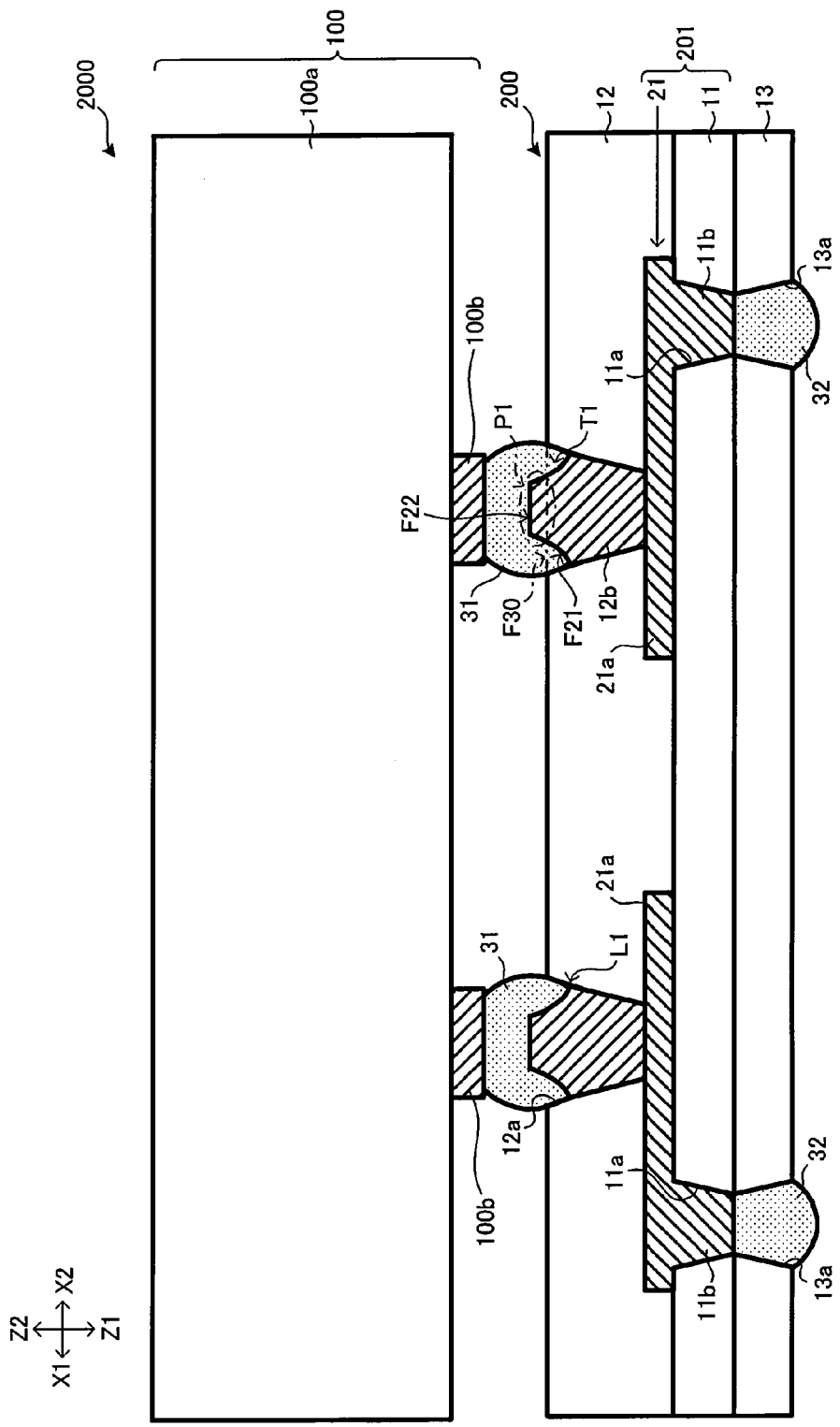
FIG. 20 is a cross-sectional view showing a semiconductor device having a wiring board according to the second embodiment of the present invention.

As shown in FIG. 20, in semiconductor device 2000 of the present embodiment, semiconductor chip 100 is mounted on the Z2 side of insulation layer 12 by inverting the direction from that in the first embodiment. In particular, electrode pad (100b) of semiconductor chip 100 is electrically connected to bump 31 formed on connection conductor (12b) in insulation layer 12.

As described, in the present embodiment, semiconductor chip 100 is mounted on the Z2 side of insulation layer 12. However, the same as in the first embodiment, rewiring section 201 is formed on the Z1 side of insulation layer 12. Also, the structure of rewiring section 201 is the same as that in the first embodiment. Accordingly, in the present embodiment, the pitch of electrode pads (100b) of semiconductor chip 100 fans out through rewiring section 201. Namely, the pitch of bumps 32 is greater than the pitch of bumps 31.

Also, on the Z1 side of rewiring section 201, solder resist 13 is formed having holes (13a) (via hole) on via conductors (11b) (the Z1 side). Then, bump 32 is formed in each hole (13a).

Here, solder resist 13 is made of photosensitive resin using acrylic-epoxy resin, thermosetting resin primarily containing epoxy resin, UV curing resin or the like. Solder resist 13 may be formed by screen printing, spray coating, roll coating, lamination or the like, for example. Also, bumps 32 are solder bumps, for example. The method for forming bumps 32 is the same as the method for forming bumps 31 described above.

Figure 21A:
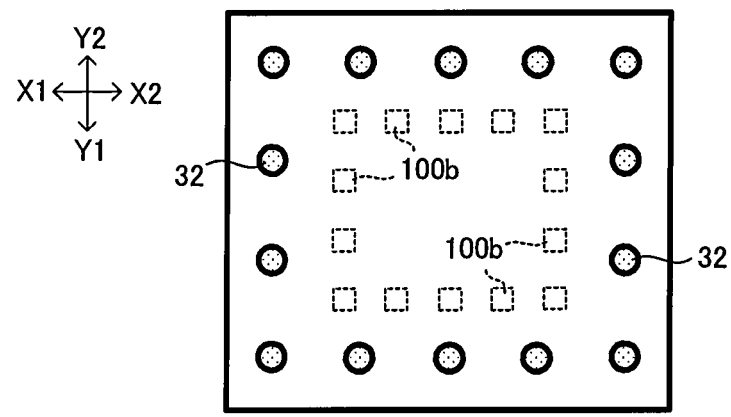
FIG. 21A is a view showing a first example of positioning electrode pads of a semiconductor chip and bumps (external connection terminals) according to the second embodiment of the present invention.
Figure 21B:
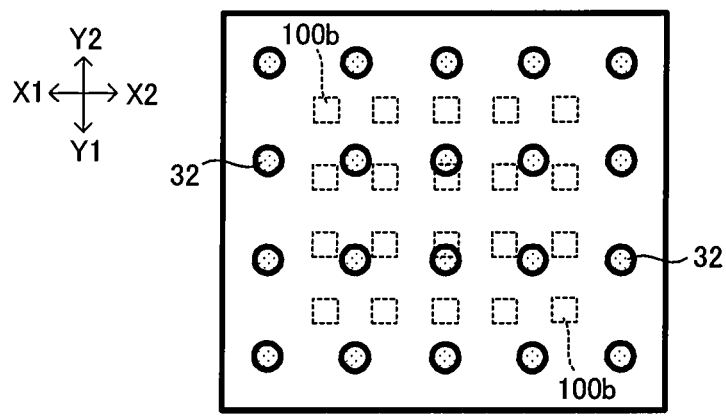
FIG. 21B is a view showing a second example of positioning electrode pads of a semiconductor chip and bumps (external connection terminals) according to the second embodiment of the present invention.

In the present embodiment, positioning electrodes (100b) of semiconductor chip 100 and bumps 32 may be determined freely. For example, as shown in FIG. 21A, electrode pads (100b) may be positioned in a peripheral style (peripheral-terminal type), while bumps 32 are positioned in a peripheral style (peripheral-terminal type) with a wider terminal pitch. Alternatively, as shown in FIG. 21B, for example, electrode pads (100b) may be positioned in an area-array style, while bumps 32 are positioned in an area-array style with a wider terminal pitch. However, positioning each terminal is not limited to those.

The same or substantially the same effects as those described in the first embodiment are achieved by the above semiconductor device 2000 of the present embodiment.

So far, semiconductor devices and their manufacturing methods according to the embodiments of the present invention have been described. However, the present invention is not limited to the above embodiments.

In each of the above embodiments, examples in which insulation layer 12 is single-layered are described. However, insulation layer 12 may be formed with two or more layers.

Figure 22:
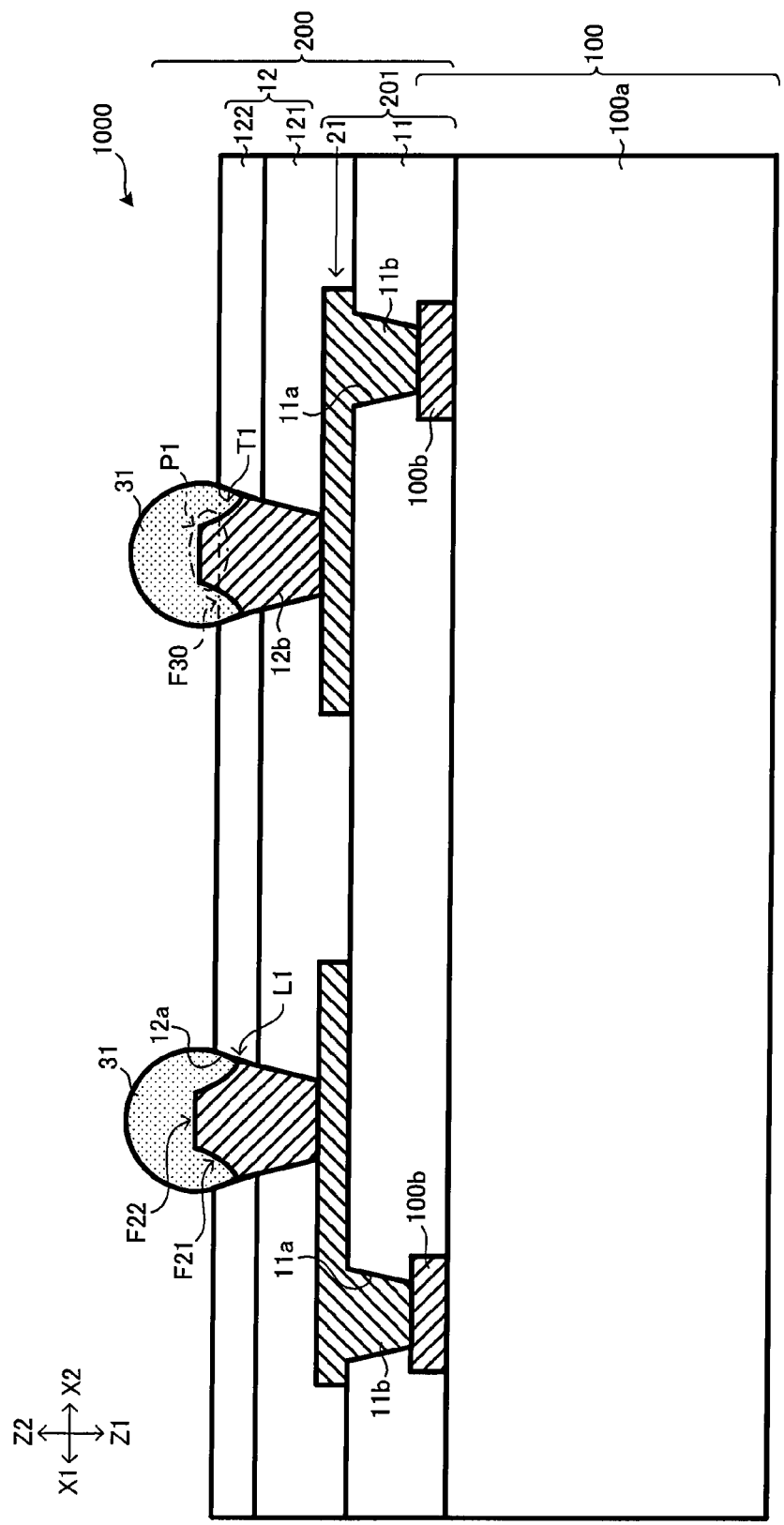
FIG. 22 is a cross-sectional view showing an example of a double-layered insulation layer (outermost layer) in a semiconductor device according to the first embodiment.

FIG. 22 shows an example in which insulation layer 12 in semiconductor device 1000 of the first embodiment is double-layered. In this example, insulation layer 12 is formed with Z1-side first insulation layer 121 (lower-layer insulative section) and Z2-side second insulation layer 122 (upper-layer insulative section). Here, the elastic coefficient of second insulation layer 122 is preferred to be set lower than the elastic coefficient of first insulation layer 121. Also, contact line (L1) between tip portion (P1) of connection conductor (12b) and insulation layer 12 is preferred to be in second insulation layer 122. Since cracking tends to occur near the second surface of insulation layer 12, especially near contact line (L1), cracking is suppressed if the area of contact line (L1) is soft (lower elastic coefficient). Also, if the thermal expansion coefficient of second insulation layer 122 is set higher than that of first insulation layer 121, then substantially the same effects as above are considered to be achieved. In addition, insulation layer 12 in semiconductor device 2000 (FIG. 20) of the second embodiment may also be formed as double-layered. In such a case, substantially the same effects as above are achieved if elastic coefficients and thermal expansion coefficients of first insulation layer 121 and second insulation layer 122 are set in the same relationships as above.

Figure 23A:
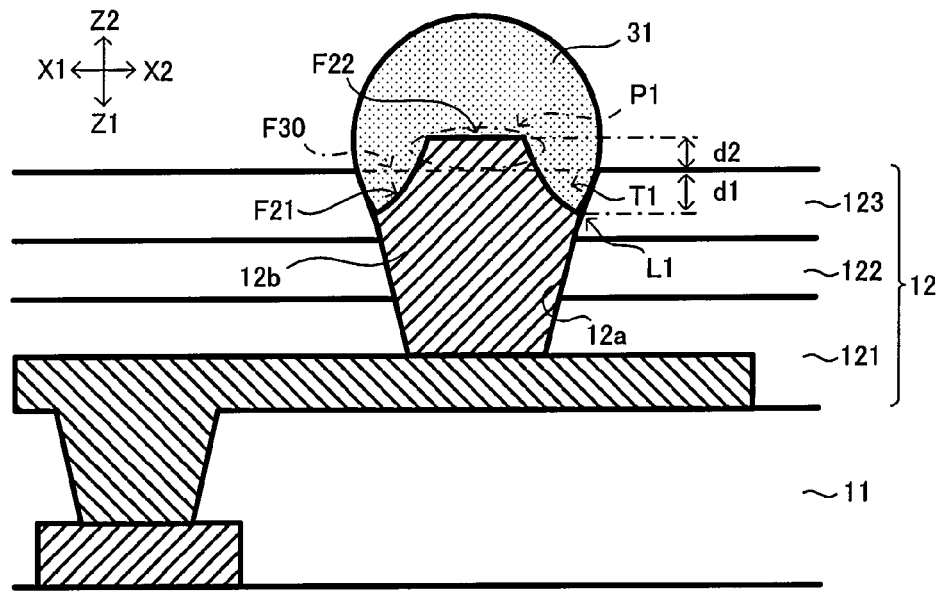
FIG. 23A is a cross-sectional view showing a first example of a triple-layered insulation layer (outermost layer)
Figure 23B:
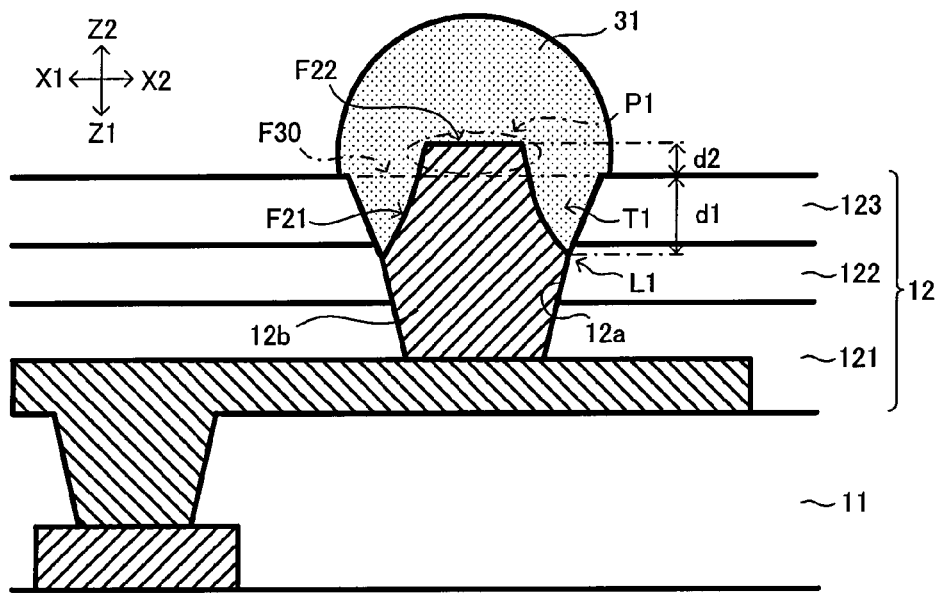
FIG. 23B is a cross-sectional view showing a second example of a triple-layered insulation layer (outermost layer)

FIGS. 23A and 23B show examples in which insulation layer 12 is triple-layered. In those examples, insulation layer 12 is formed with first insulation layer 121, second insulation layer 122 and third insulation layer 123. Third insulation layer 123 is positioned on second insulation layer 122 (the Z2 side) and second insulation layer 122 is positioned on first insulation layer 121 (the Z2 side). Here, if the elastic coefficient of third insulation layer 123 is the lowest, contact line (L1) between tip portion (P1) of connection conductor (12b) and insulation layer 12 is preferred to be in third insulation layer 123 as shown in FIG. 23A. Also, if the elastic coefficient of second insulation layer 122 is the lowest, contact line (L1) between tip portion (P1) of connection conductor (12b) and insulation layer 12 is preferred to be in second insulation layer 122 as shown in FIG. 23B. In doing so, cracking is suppressed from occurring as described above. The same applies if insulation layer 12 is formed with four or more layers.

Figure 24:
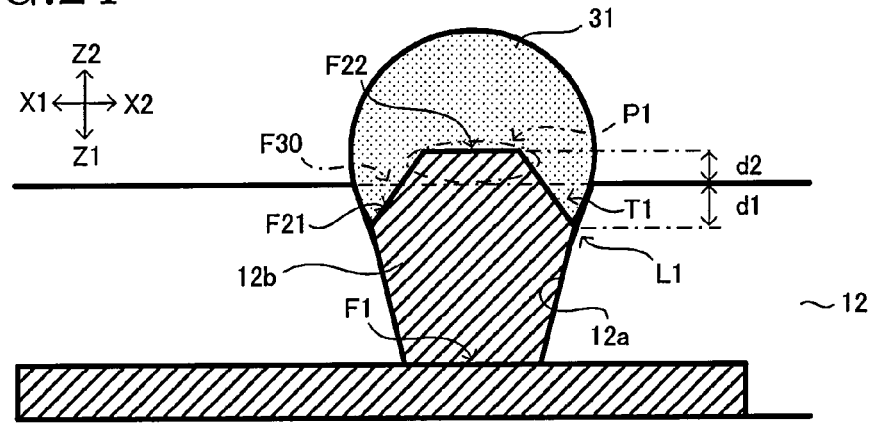
FIG. 24 is a cross-sectional view showing an example in which a tapered surface is an inclined surface (a plane)

Side surface (F21) of connection conductor (12b) is not always required to be a curved surface. For example, as shown in FIG. 24, side surface (F21) may be an inclined surface (a plane).

Figure 25A:
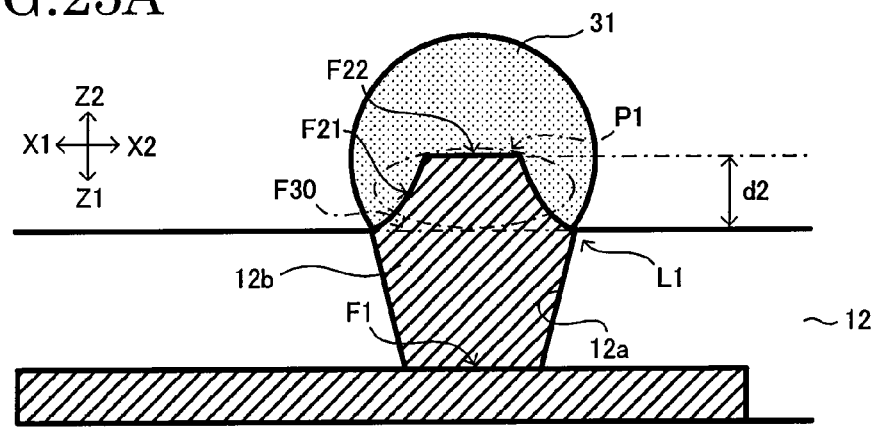
FIG. 25A is a cross-sectional view showing an example in which the position of a contact line corresponds to the second surface of the insulation layer (outermost layer)
Figure 25B:
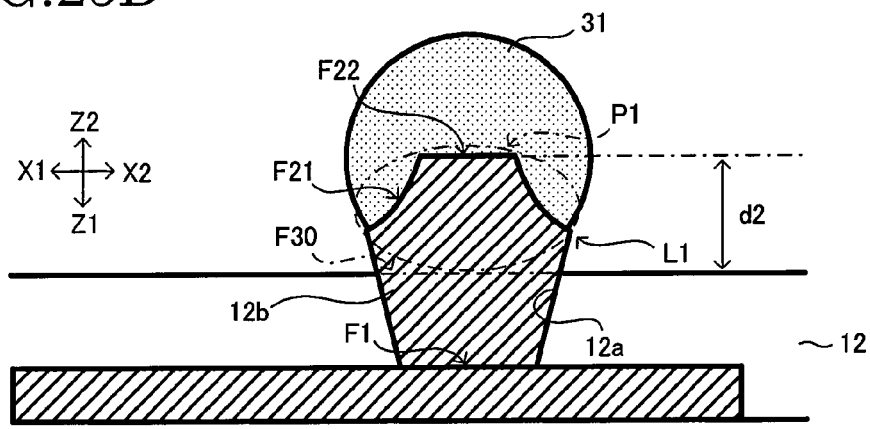
FIG. 25B is a cross-sectional view showing an example in which a contact line is positioned beyond the second surface of the insulation layer (outermost layer)

In each of the above embodiments, contact line (L1) between tip portion (P1) of connection conductor (12b) and insulation layer 12 was set to be positioned toward the Z1 side from the second surface of insulation layer 12. However, the position of contact line (L1) is not limited to the above, and as shown in FIG. 25A, for example, it may correspond to the second surface of insulation layer 12, or as shown in FIG. 25B, for example, it may be toward the Z2 side (outside) beyond the second surface of insulation layer 12.

Top surface (F22), side surface (F21) and hole (12a) are not limited to being formed as those shown in FIG. 4, and they may be modified properly.

Figure 26A:
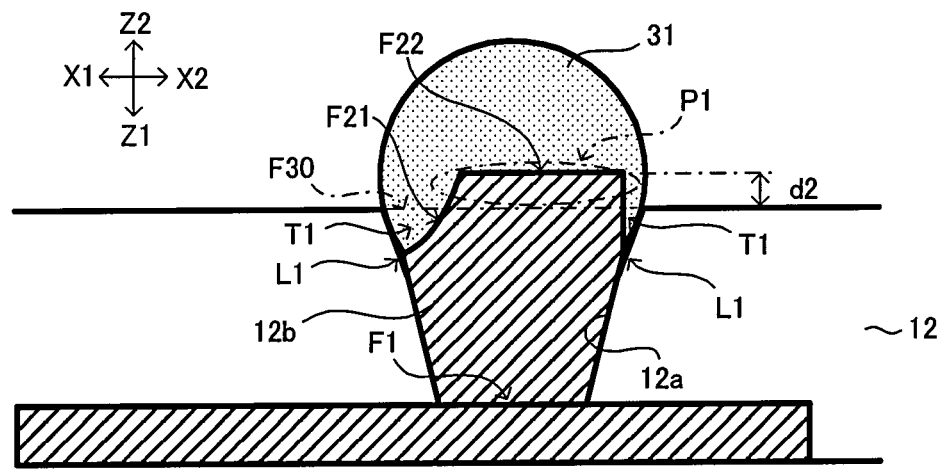
FIG. 26A is a cross-sectional view showing an example in which only one side of the top surface tapers.
Figure 26B:
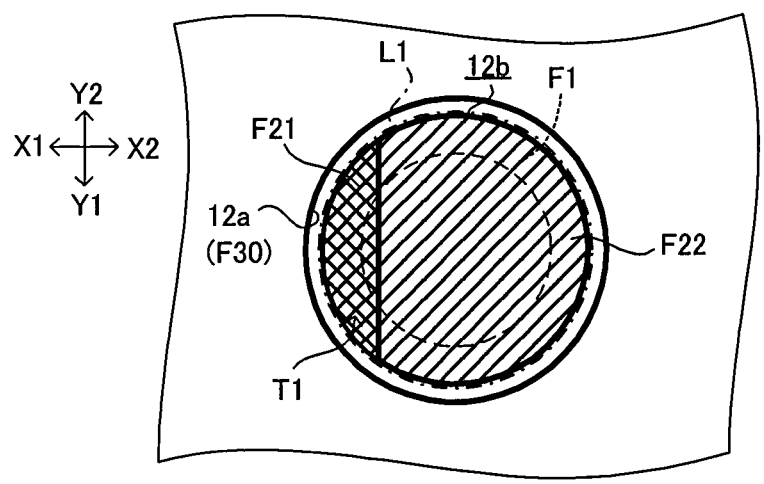
FIG. 26B is a view showing a planar structure of the connection conductor shown in FIG. 26A.
Figure 27:
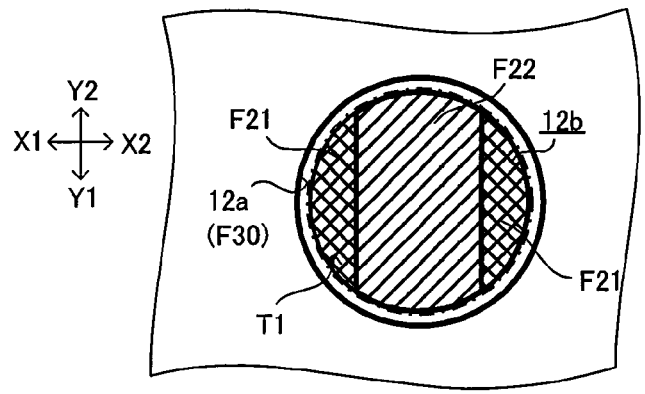
FIG. 27 is a view showing an example in which only two sides of a top surface taper.

For example, as shown in FIGS. 26A and 26B, only the X1 side of top surface (F22) may taper. Alternatively, as shown in FIG. 27, for example, only the X1 side and X2 side of top surface (F22) may taper. However, to ensure a sufficient width of groove (T1), side surface (F21) is preferred to be positioned around top surface (F22).

Figure 28:
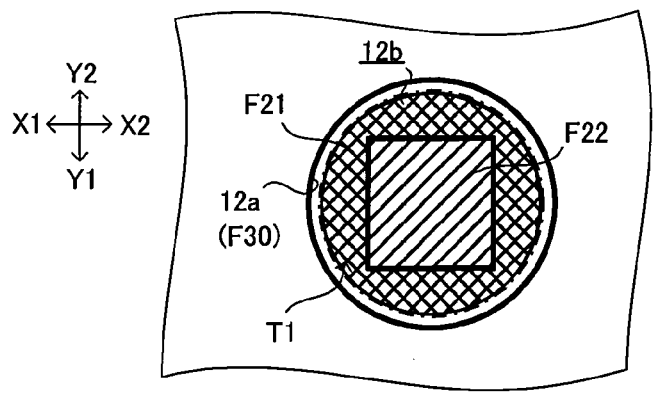
FIG. 28 is a view showing an example in which a horizontal cross section (X-Y plane) on a top surface is formed to be a quadrangle.

A horizontal cross section (X-Y plane) of top surface (F22) may be formed to be a polygon such as a quadrangle as shown in FIG. 28, for example.

Figure 29:
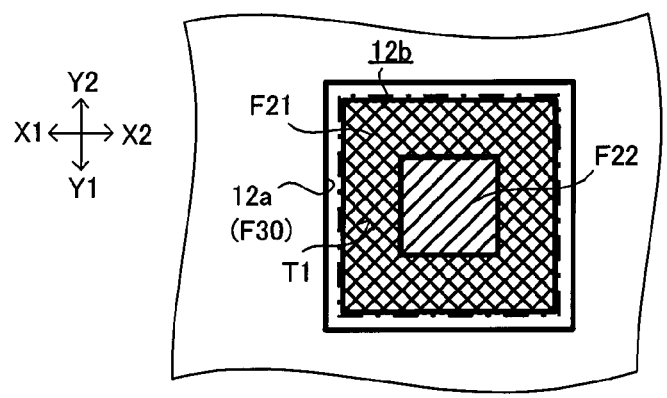
FIG. 29 is a view showing an example in which a horizontal cross section (X-Y plane) of a hole is formed to be a quadrangle.

The Z2-side opening surface (F30) (X-Y plane) of hole (12a) may also be formed to be a polygon such as a quadrangle as shown in FIG. 29, for example. Alternatively, it is an option for hole (12a) not to be tapered.

Figure 30:
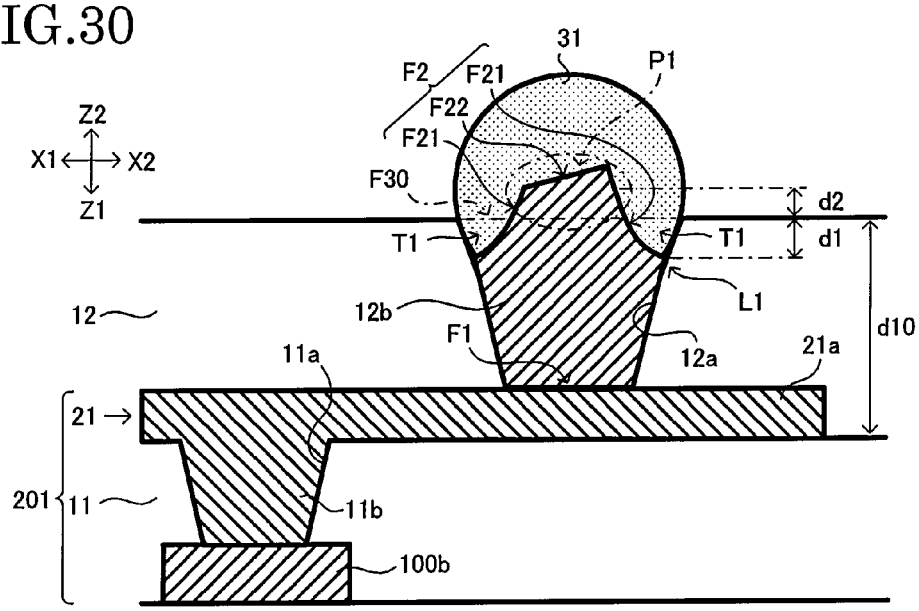
FIG. 30 is a view showing an example in which the top surface of a connection conductor is an inclined surface sloped against the X-Y plane.

Top surface (F22) is not limited to being on the X-Y plane, and as shown in FIG. 30, for example, it may be an inclined surface (a flat surface) sloped against the X-Y plane.

Figure 31:
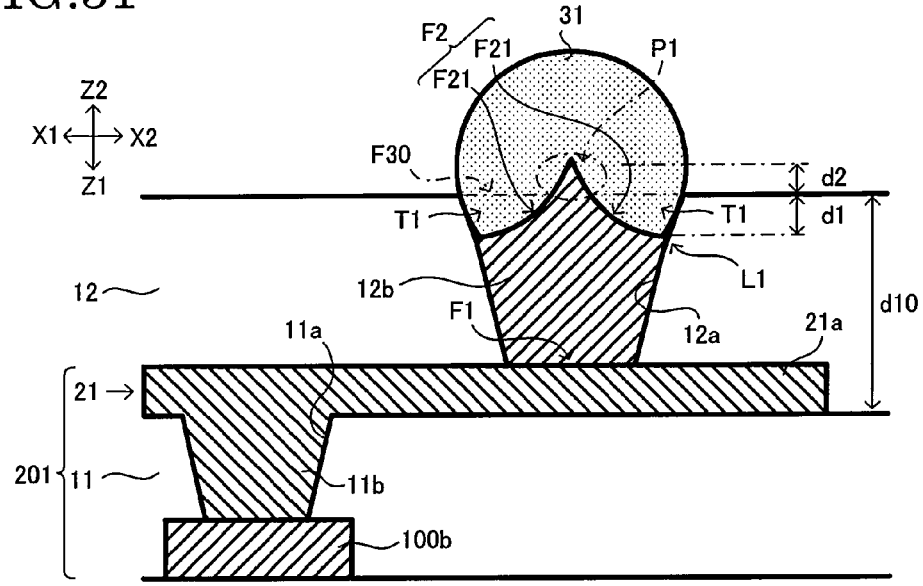
FIG. 31 is a view showing an example in which the entire outer-layer side end surface of a connection conductor tapers.

As shown in FIG. 31, the entire end surface (F2) on the Z2 side of connection conductor (12b) may be tapered.

In each of the above embodiments, conductive pattern 21 is formed on insulation layer 11. However, insulation layer 11 may be formed to have two or more layers, and conductive pattern 21 may be formed in insulation layer 11. In such a case, the conductor of conductive pattern 21 is structured as trench wiring.

Figure 32A:
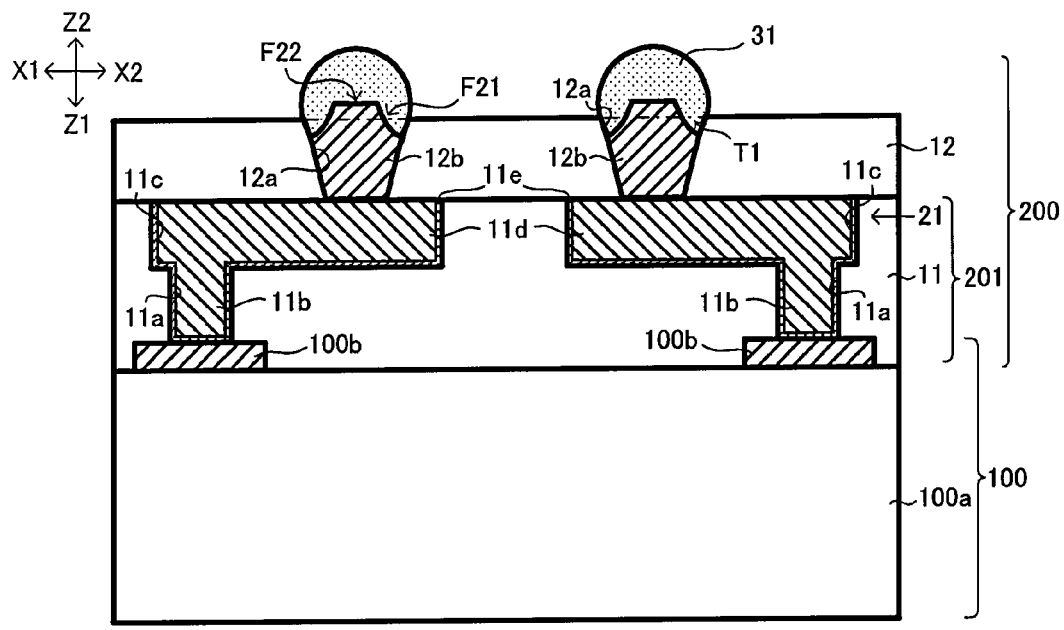
FIG. 32A is a cross-sectional view showing an example in which the conductor of a conductive pattern in a wiring board according to the first embodiment is structured as trench wiring.
Figure 32B:
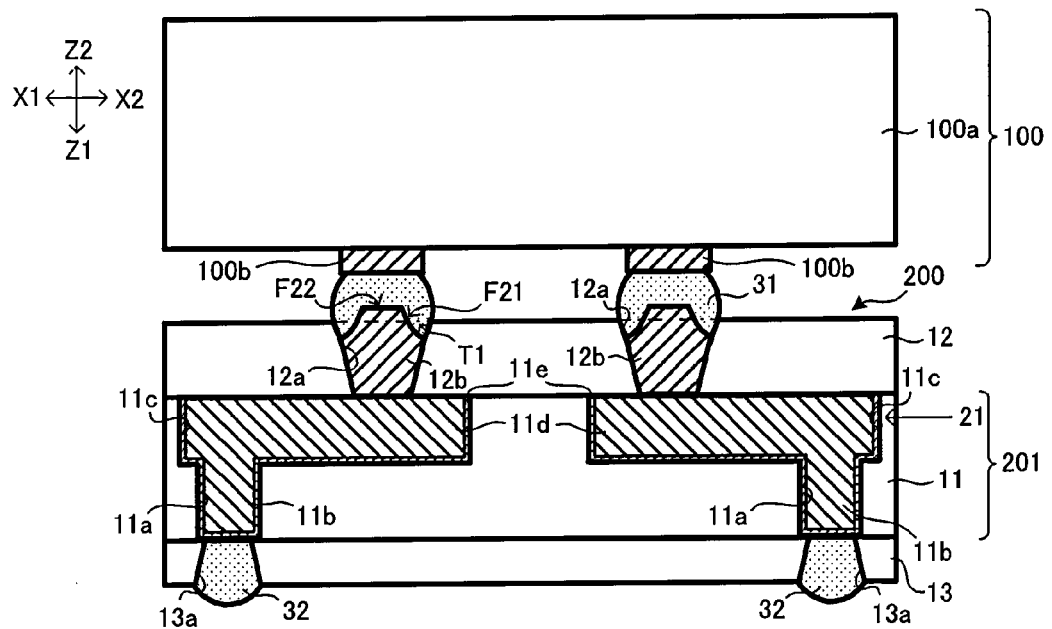
FIG. 32B is a cross-sectional view showing an example in which the conductor of a conductive pattern in a wiring board according to the second embodiment is structured as trench wiring.

FIGS. 32A and 32B each show an example in which the conductor of conductive pattern 21 is structured as trench wiring (11d) for the first and second embodiments respectively. In those examples, groove (11c) for conductive pattern 21 (trench wiring 11d) and hole (11a) for via conductor (11b) are formed in insulation layer 11. Groove (11c) and hole (11a) are formed to be contiguous. On the inner surfaces (side and bottom surfaces) of groove (11c) and hole (11a), feed layer (11e) made of electroless plating or the like is formed, and conductor (such as copper) is filled inside. Accordingly, trench wiring (11d) is formed in groove (11c) and via conductor (11b) is formed in hole (11a). Trench wiring (11d) and via conductor (11b) are formed to be integrated.

The above structure is formed using a laser, for example. Namely, after groove (11c) and hole (11a) are formed in insulation layer 11 all at once by a laser, copper plating, for example, is filled in groove (11c) and hole (11a). Then, the copper-plated layer is polished to expose the surface of insulation layer 11. However, the method for forming trench wiring (11d) and via conductor (11b) is not limited to the above.

Regarding other features, structures of the above semiconductor devices (1000, 2000) and their elements such as the type, performance, measurements, quality, structure, number of layers, positioning and so forth may be modified freely within a scope that does not deviate from the gist of the invention.

The material for each conductive pattern is not limited to the above, and may be modified according to usage requirements or the like. For example, metal other than copper may be used as the material for conductive patterns. Also, the material for each insulation layer is not limited to a specific type. However, as for resins to form insulation layers, thermosetting resins or thermoplastic resins are preferred. As for thermosetting resins, for example, other than epoxy resin and polyimide, the following may be used: BT resin, allyl polyphenylene ether resin (A-PPE resin) or aramid resin. Also, as for thermoplastic resins, for example, liquid-crystal polymer (LCP), PEEK resin or PTFE resin (fluororesin) may be used. Such materials are preferred to be selected according to requirements from the viewpoints of insulation, dielectric properties, tolerance to heat, mechanical features and so forth. In addition, the above resins may contain additives such as a curing agent, a stabilizer, filler or the like. Alternatively, each conductive pattern and each insulation layer may be formed with multiple layers made of different materials.

The manufacturing process of a semiconductor device is not limited to the order and contents shown in the flowchart in FIG. 10, and the order and contents may be modified within a scope that does not deviate from the gist of the present invention. Also, depending on usage requirements or the like, some steps may be omitted.

In each of the above embodiments, a conductive pattern was formed on the conductor in hole (12a) and on insulation layer 12 by forming seed layer 1001 (electroless plating) and electrolytic plating 1002 inside hole (12a) (opening portion) and on insulation layer 12 (second insulation layer) prior to forming resist 1003 (FIG. 18). However, the above embodiments are not limited to such, and the conductive pattern may be formed on insulation layer 12 by forming metal foil and plating on insulation layer 12 (second insulation layer) using a subtractive method, for example, prior to forming resist 1003.

Figure 33A:
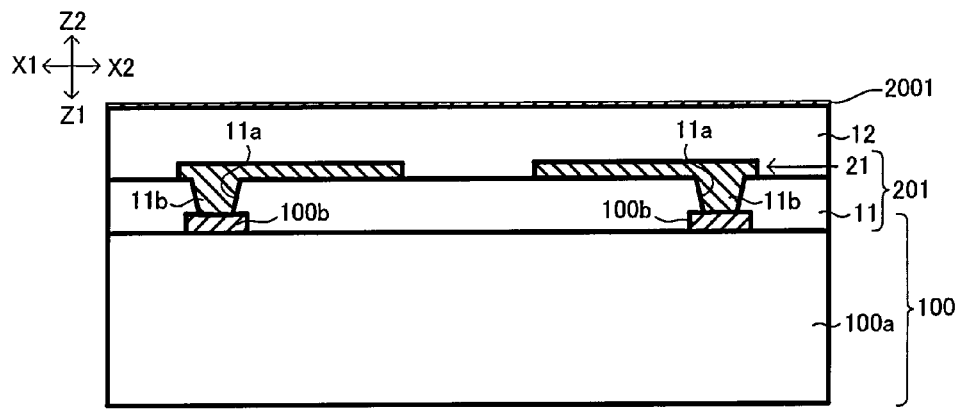
FIG. 33A is a view to illustrate a first step for forming a conductive pattern by a subtractive method.
Figure 33B:
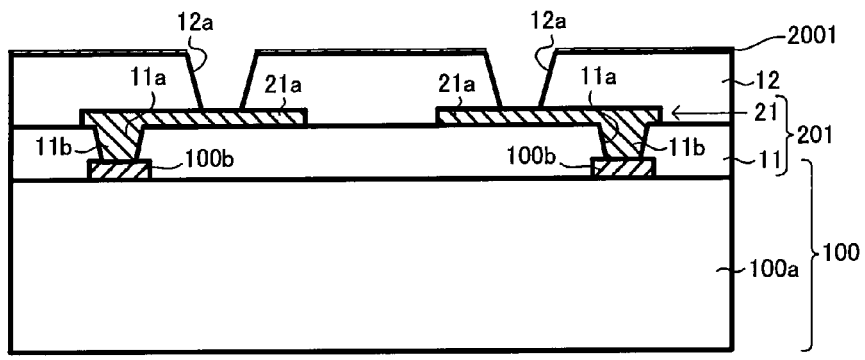
FIG. 33B is a view to illustrate a second step for forming a conductive pattern by a subtractive method.
Figure 33C:
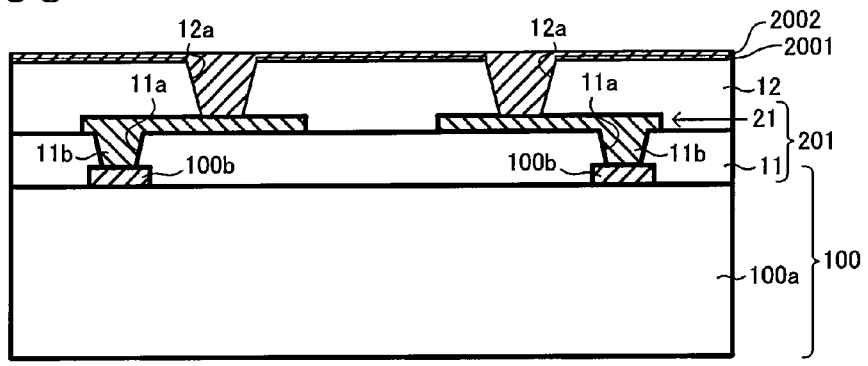
FIG. 33C is a view to illustrate a third step for forming a conductive pattern by a subtractive method.

Specifically, after the structure shown in FIG. 14 is formed the same as in the first embodiment, for example, metal foil 2001 (such as copper foil) is formed on insulation layer 12 by lamination, for example, as shown in FIG. 33A. Next, as shown in FIG. 33B, using a laser, for example, hole (12a) is formed, penetrating through metal foil 2001 and insulation layer 12 and reaching conductor (21a) of conductive pattern 21. Then, as shown in FIG. 33C, electrolytic plating is performed using metal foil 2001 as a feed layer. Accordingly, electrolytic copper plating 2002, for example, is formed on the second surface of insulation layer 12 and in hole (12a). As a result, conductor (electrolytic plating 2002) is filled in hole (12a), while a conductive pattern is formed on the conductor in hole (12a) and on insulation layer 12. Namely, in this case, the conductor in hole (12a) is made only of electrolytic plating 2002, and the conductive pattern on insulation layer 12 is formed with metal foil 2001 (such as copper foil) and plating (electrolytic plating 2002). The subsequent steps are the same as in the first embodiment (see FIGS. 18~19).

The above embodiments, modified examples and so forth may be combined freely. It is preferred to select an appropriate combination according to usage requirements or the like. For example, the structure shown in FIGS. 22~31 may be applied to a semiconductor device having trench wiring as shown in FIG. 32A or FIG. 32B.

A wiring board according to the first aspect of the present invention has a first insulation layer having a first surface and a second surface opposite the first surface; a conductive pattern formed on the second surface of the first insulation layer; a second insulation layer formed on the first insulation layer and having an opening portion to expose at least part of the conductive pattern; a connection conductor formed on the conductive pattern which is exposed through the opening portion; and a bump formed on the connection conductor. A tip portion of the connection conductor protrudes from a surface of the second insulation layer and has a side surface tapering toward the tip.

A method for manufacturing a wiring board according to the second aspect of the present invention includes the following: forming a first insulation layer having a first surface and a second surface opposite the first surface; forming a conductive pattern on the second surface of the first insulation layer; forming a second insulation layer on the second surface of the first insulation layer to coat the conductive pattern; in the second insulation layer, forming an opening portion to expose at least part of the conductive pattern; forming a conductor in the opening portion; forming a conductive pattern on the conductor in the opening portion and on the second insulation layer; on the conductive pattern formed on the conductor in the opening portion or on the second insulation layer, forming etching resist having an opening to expose part of the conductive pattern; removing the conductive pattern exposed through the opening of the etching resist; and forming a connection conductor on the conductive pattern exposed through the opening portion in the second insulation layer. A tip portion of the connection conductor protrudes from a surface of the second insulation layer and has a side surface tapering toward the tip.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a first insulation layer;
   a conductive pattern formed on the first insulation layer;
   a second insulation layer formed on the conductive pattern and the first insulation layer and having an opening portion exposing at least a portion of the conductive pattern; and
   a connection conductor formed in the opening portion of the second insulation layer such that the connection conductor is positioned on the portion of the conductive pattern,
   wherein the connection conductor has a tip portion which protrudes from a surface of the second insulation layer and which has a tapered side surface tapering toward an end of the tip portion, the second insulation layer has a lower-layer insulative section and an upper-layer insulative section, and the upper-layer insulative section of the second insulation layer is formed on the lower-layer insulative section of the second insulation layer and has an elastic coefficient which is lower than an elastic coefficient of the lower-layer insulative section.

2. The wiring board according to claim 1, further comprising a bump formed on the connection conductor, wherein the tapered side surface of the tip portion of the connection conductor is formed such that a recess is formed between the connection conductor and the second insulation layer, and the recess is filled by a portion of the bump.

3. The wiring board according to claim 1, wherein the tip portion of the connection conductor has a flat top surface.

4. The wiring board according to claim 1, wherein the tapered side surface of the tip portion of the connection conductor has a curved surface.

5. The wiring board according to claim 1, wherein the lower-layer insulative section of the second insulation layer has a thermal expansion coefficient which is lower than a thermal expansion coefficient of the upper-layer insulative section of the second insulation layer.

6. The wiring board according to claim 1, wherein the tip portion of the connection conductor and the second insulation layer form a contact line in the upper-layer insulative section.

7. The wiring board according to claim 1, further comprising a bump formed on the connection conductor, wherein the bump is made of solder.

8. The wiring board according to claim 1, further comprising a semiconductor element, wherein the first insulation layer is formed on the semiconductor element.

9. The wiring board according to claim 8, further comprising a via conductor formed in the first insulation layer, wherein the semiconductor element has an electrode which is connected to the conductive pattern by the via conductor.

10. The wiring board according to claim 1, wherein the first insulation layer comprises at least one of a thermosetting resin and a thermoplastic resin, and the second insulation layer comprises at least one of a thermosetting resin and a thermoplastic resin.

11. A method for manufacturing a wiring board, comprising:
forming a first insulation layer;
forming a conductive pattern on the first insulation layer;
forming a second insulation layer on the conductive pattern and the first insulation layer such that the second insulation layer covers the conductive pattern;
forming in the second insulation layer an opening portion such that at least a portion of the conductive pattern is exposed;
forming a conductor in the opening portion such that the conductor is positioned on the portion of the conductive pattern; and
removing a portion of the conductor in the opening portion such that a connection conductor having a tip portion which protrudes from a surface of the second insulation layer and which has a tapered side surface tapering toward an end of the tip portion is formed on the portion of the conductive pattern exposed through the opening portion in the second insulation layer, wherein the forming of the second insulation layer comprising forming a lower-layer insulative section and an upper-layer insulative section on the lower-layer insulative section such that the upper-layer insulative section has an elastic coefficient which is lower than an elastic coefficient of the lower-layer insulative section.

12. The method for manufacturing a wiring board according to claim 11, wherein the forming of the conductor in the opening portion comprises forming an electroless plating layer and an electrolytic plating layer in the opening portion and on the second insulation layer.

13. The method for manufacturing a wiring board according to claim 11, further comprising forming a conductive layer on the second insulation layer by forming a metal foil and plating on the second insulation layer.

14. The method for manufacturing a wiring board according to claim 11, wherein the removing of the portion of the conductor in the opening portion comprises forming an etching resist layer on the conductor in the opening portion and on the second insulation layer and patterning the etching resist layer such that the portion of the conductor in the opening portion is removed by etching.

15. The method for manufacturing a wiring board according to claim 11, further comprising forming a bump on the tip portion of the connection conductor.

16. The method for manufacturing a wiring board according to claim 11, wherein the forming of the conductor in the opening portion comprises forming an electroless plating layer and an electrolytic plating layer in the opening portion and on the second insulation layer, and the removing of the portion of the conductor in the opening portion comprises forming an etching resist layer on the conductor in the opening portion and on the second insulation layer and patterning the etching resist layer such that the portion of the conductor in the opening portion is removed by etching.

17. The method for manufacturing a wiring board according to claim 11, wherein the forming of the first insulation layer comprises forming the first insulation layer on a semiconductor element.

18. The method for manufacturing a wiring board according to claim 11, further comprising forming a via conductor in the first insulation layer such that the conductive pattern is connected to an electrode of a semiconductor element, wherein the forming of the first insulation layer comprises forming the first insulation layer on the semiconductor element.

19. The method for manufacturing a wiring board according to claim 11, further comprising forming a bump on the tip portion of the connection conductor, wherein the removing of the portion of the conductor in the opening portion comprises forming a recess between the connection conductor and the second insulation layer, and the forming of the bump comprises filling the recess by a portion of the bump.

20. The method for manufacturing a wiring board according to claim 11, wherein the removing of the portion of the conductor in the opening portion comprises forming a flat top surface in the tip portion of the connection conductor.

* * * * *